(12) United States Patent
Shibasaki et al.

(10) Patent No.: US 11,171,253 B2
(45) Date of Patent: Nov. 9, 2021

(54) SOLAR CELL, MULTI-JUNCTION SOLAR CELL, SOLAR CELL MODULE, AND PHOTOVOLTAIC SYSTEM

(71) Applicant: KABUSHIKI KAISHA TOSHIBA, Tokyo (JP)

(72) Inventors: Soichiro Shibasaki, Nerima Tokyo (JP); Miyuki Shiokawa, Kawasaki Kanagawa (JP); Sara Yoshio, Taito Tokyo (JP); Naoyuki Nakagawa, Setagaya Tokyo (JP); Yukitami Mizuno, Ota Tokyo (JP); Kohei Nakayama, Kawasaki Kanagawa (JP); Mutsuki Yamazaki, Yokohama Kanagawa (JP); Yoshiko Hiraoka, Kawasaki Kanagawa (JP); Kazushige Yamamoto, Yokohama Kanagawa (JP); Yuya Honishi, Yokohama Kanagawa (JP); Takeshi Niimoto, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 106 days.

(21) Appl. No.: 15/691,984

(22) Filed: Aug. 31, 2017

(65) Prior Publication Data
US 2018/0083150 A1    Mar. 22, 2018

(30) Foreign Application Priority Data

Sep. 21, 2016 (JP) .............................. JP2016-184414
Mar. 22, 2017 (JP) .............................. JP2017-056528

(51) Int. Cl.
*H01L 31/054* (2014.01)
*H01L 31/046* (2014.01)
(Continued)

(52) U.S. Cl.
CPC .... *H01L 31/054* (2014.12); *H01L 31/022425* (2013.01); *H01L 31/022433* (2013.01);
(Continued)

(58) Field of Classification Search
CPC . H01L 31/054; H01L 31/0236; H01L 31/036; H01L 31/0725; H01L 31/046;
(Continued)

(56) References Cited

U.S. PATENT DOCUMENTS

2005/0229744 A1* 10/2005 Kijima .................... B22F 9/24
75/255
2006/0090790 A1* 5/2006 Kobayashi ........ H01L 31/02168
136/256
(Continued)

FOREIGN PATENT DOCUMENTS

JP    09-219530    8/1997
JP    2004-296749    10/2004
(Continued)

*Primary Examiner* — Lindsey A Bernier
(74) *Attorney, Agent, or Firm* — Amin, Turocy & Watson, LLP

(57) ABSTRACT

A solar cell of an embodiment includes: a first electrode; a second electrode; a light-absorbing layer interposed between the first electrode and the second electrode; a dot region interposed between the first electrode and the light-absorbing layer, the dot region including dots.

20 Claims, 13 Drawing Sheets

(51) Int. Cl.
  *H01L 31/0224* (2006.01)
  *H01L 31/032* (2006.01)
(52) U.S. Cl.
  CPC ........... *H01L 31/022466* (2013.01); *H01L 31/022491* (2013.01); *H01L 31/0322* (2013.01); *H01L 31/046* (2014.12); *Y02E 10/52* (2013.01); *Y02E 10/541* (2013.01)
(58) Field of Classification Search
  CPC ..... H01L 31/022466; H01L 31/022433; H01L 31/022491; Y02E 10/50
  See application file for complete search history.

(56) References Cited

U.S. PATENT DOCUMENTS

| | | | | |
|---|---|---|---|---|
| 2009/0320916 | A1* | 12/2009 | Yuan | C23C 18/08 136/256 |
| 2011/0056538 | A1* | 3/2011 | Myong | H01L 31/02168 136/246 |
| 2011/0272010 | A1* | 11/2011 | Abou-Kandil | H01L 31/022483 136/255 |
| 2012/0260985 | A1 | 10/2012 | Huh et al. | |
| 2012/0325305 | A1* | 12/2012 | Chandra | B82Y 30/00 136/256 |
| 2013/0174902 | A1* | 7/2013 | Hayashi | H01L 31/02168 136/256 |
| 2013/0327928 | A1* | 12/2013 | Leach | B82Y 20/00 250/216 |
| 2014/0216543 | A1 | 8/2014 | Sugimoto | |
| 2014/0238485 | A1 | 8/2014 | Mizuno et al. | |
| 2014/0246171 | A1* | 9/2014 | Kursat Sendur | F28F 27/00 165/58 |
| 2015/0034160 | A1* | 2/2015 | Wu | H01L 31/02168 136/262 |
| 2016/0087118 | A1 | 3/2016 | Shibasaki et al. | |
| 2018/0269341 | A1 | 9/2018 | Shibasaki et al. | |

FOREIGN PATENT DOCUMENTS

| | | |
|---|---|---|
| JP | 2005-197597 | 7/2005 |
| JP | 5116869 | 10/2012 |
| JP | 2013-098195 | 5/2013 |
| JP | 5875124 | 1/2016 |
| JP | 2016-063160 | 4/2016 |
| JP | 5949335 | 6/2016 |
| JP | 2016-157807 | 9/2016 |

* cited by examiner

SOLAR CELL, MULTI-JUNCTION SOLAR CELL, SOLAR CELL MODULE, AND PHOTOVOLTAIC SYSTEM

CROSS-REFERENCE TO RELATED APPLICATION

This application is based upon and claims the benefit of priority from Japanese Percent Applications No. 2016-184414, filed on Sep. 21, 2016 and 2017-056528, filed on Mar. 22, 2017; the entire contents of which are incorporated herein by reference.

FIELD

Embodiments described herein relate to a solar cell, a multi-junction solar cell, a solar cell module, and a photovoltaic system.

BACKGROUND

An example of a high-efficiency solar cell is a multi-junction (tandem) solar cell. A cell effective for each wavelength range can be used so that high efficiency is expected in comparison to a uni-junction. A chalcopyrite solar cell including, for example, CIGS, is known to have high efficiency, and can be made wide-gap so as to be a candidate for a toe cell. However, when the chalcopyrite solar cell is used as the top cell, a transparent electrode is required to transmit light being the bandgap or less. When a light-absorbing layer is directly produced on the transparent electrode, the interface therebetween oxidizes so that a favorable contact cannot be formed and efficiency barely increases.

DETAILED DESCRIPTION

A solar cell of an embodiment includes: a first electrode; a second electrode; a light-absorbing layer interposed, between the first electrode and the second electrode; a dot region interposed between the first electrode and the light-absorbing layer, the dot region including dots.

Embodiments of the present disclosure will be described in detail below with respect to the drawings.

First Embodiment

Figure 1:
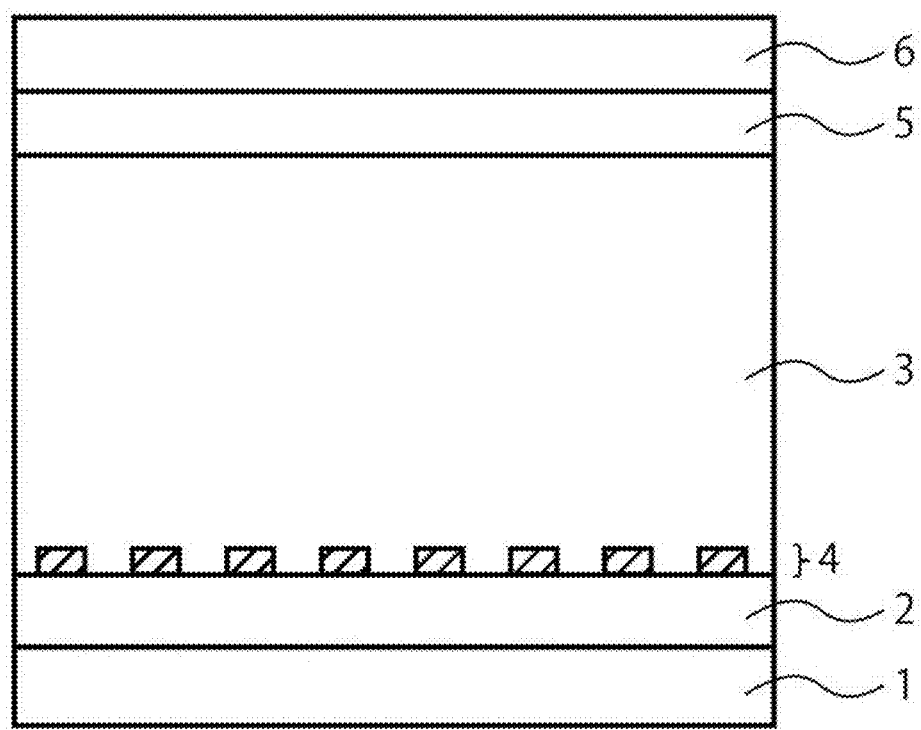
FIG. 1 is a sectional conceptual view of a solar cell according to a first embodiment.

As illustrated in FIG. 1, a solar cell 100 according to the present embodiment includes a substrate 1 and a first electrode 2 on the substrate 1. A light-absorbing layer 3 and an n-type layer 5 are interposed between the first electrode 2 and a second electrode 6. The light-absorbing layer 3 is interposed between the first electrode 2 and the n-type layer 5. A dot region 4 is provided between the first electrode 2 and the light-absorbing layer 3.

(Substrate)

Soda lime glass is desirably used as the substrate 1 according to the embodiment, and glass in general, such as quartz, white glass, or chemically strengthened glass, or resin, such as polyimide or acrylic, can be also used.

(First Electrode)

The first electrode 2 according to the embodiment is an electrode of the solar cell 100. The first electrode 2 is, for example, a transparent electrode including a semiconductor film formed on the substrate 1. The first electrode 2 is interposed between the substrate 1 and the light-absorbing layer 3. A semiconductor film including at least indium-tin oxide (ITO), can be used as the first electrode 2. A layer including an oxide, such as $SnO_2$, $TiO_2$, carrier-doped ZnO:Ga, or ZnO:Al, may be layered on the ITO on the side of the light-absorbing layer 3. ITO and $SnO_2$ may be layered from the side of the substrate 1 to the side of the light-absorbing layer 3, or ITO, $SnO_2$, and $TiO_2$ may be layered from the side of the substrate 1 to the side of the light-absorbing layer 3. A layer of the first electrode 2 in contact with the light-absorbing layer 3, is preferably an oxide layer including any of ITO, $SnO_2$, and $TiO_2$. A layer including an oxide, such as $SiO_2$, is further provided between the substrate 1 and the ITO. Sputtering is performed to the substrate 1 so as to produce the first electrode 2. The film thickness of the first electrode 2 is, for example, 100 to 1000 nm. When the solar cell according to the embodiment is used for a multi-junction solar cell, preferably, the solar cell according to the embodiment is provided on the side of a top cell or on the side of a middle cell and the first electrode 2 is a semiconductor film having translucency.

(Light-Absorbing Layer)

The light-absorbing layer 3 according to the embodiment is a p-type compound semiconductor layer. The light-absorbing layer 3 is interposed between the first electrode 2 and the n-type layer 5. The light-absorbing layer 3 is a layer including a compound including a group I element, a group III element, and a group VI element. The group I element preferably includes at least Cu. The group III element preferably includes at least Ga. The group VI element preferably includes at least Se. A compound semiconductor layer having a chalcopyrite structure, such as Cu(In, Ga)$Se_2$, $CuInTe_2$, $CuGaSe_2$, Cu(In, Al)$Se_2$, Cu(Al, Ga)(S, Se)$_2$, Cu(In, Ga)(S, Se)$_2$, CuGa(S, Se)$_2$, Ag(In, Ga)$Se_2$, including the group I (group Ib) element, the group III (group IIIb) element, and the group VI (group VIb) element, can be used as the light-absorbing layer 3. Preferably, the group Ib element includes Cu or Cu and Ag, the group IIIb element includes at least one element selected from the group consisting of Ga, Al, and In, and the group VIb element includes at least one element selected from the group consisting of Se, S, and Te. More preferably, the group Ib element includes Cu, the group IIIb element includes Ga, Al, or Ga and Al, and the group VIb element includes Se, S, or Se and S. When the group IIIb element includes a small amount of In, the bandgap of the light-absorbing layer 3 is preferably easily adjusted to be a favorable value as the top cell of the multi-junction solar cell. The film thickness of the light-absorbing layer 3 is, for example, 800 to 3000 nm.

The combination of the elements can easily adjust the bandgap in size to be a target value. The target value of the bandgap is, for example, 1.0 to 2.7 eV.

Examples of a method of producing the light-absorbing layer 3 include a vapor deposition process, such as a three stage process. Any method capable of producing the light-absorbing layer 3 on the first electrode 2 having the dot region 4, may be adopted. The method of producing the light-absorbing layer 3 can be similarly used for even a solar cell having an intermediate layer on the first electrode 2 and the dot region 4 on the intermediate layer.

(Dot Region)

The dot region 4 according to the embodiment is a region having clots interposed between the first electrode 2 and the light-absorbing layer 3. The dot region 4 includes the dots and has an aperture ratio of 50% or more. The dots are provided on a non-opening. The dots on the non-opening are in direct contact with a surface of the light-absorbing layer 3 facing the first electrode 2. A surface of the dots on the side opposite to the other surface thereof in direct contact with the light-absorbing layer 3, is in direct contact with a surface of the first electrode 2 facing the light-absorbing layer 3. The light-absorbing layer 3 is provided to an opening, namely, a region including no dots provided. The dot region 4 includes high translucency with respect to the first electrode 2, and additionally has an effect of inhibiting oxidation of a compound semiconductor included in the light-absorbing layer 3. The dot region 4 also has a function of inhibiting an oxidized region from being formed at an interface between the compound semiconductor and the first electrode 2. A contact is made to be the dots so that electric fields gather into the portion of the dots. Therefore, interface recombination is inhibited and an open voltage can improve. When the oxidization of the light-absorbing layer 3 is inhibited, the open voltage improves and conversion efficiency improves. When an insulating layer is introduced onto the first electrode 2, the contact between the first electrode 2 and the compound semiconductor is physically reduced (an insulating region corresponds to a passivation film) and additionally the interface recombination is inhibited so that the open voltage being high can be retained. The high translucency is a favorable property for the top c ell of the multi-junction solar cell. The solar cell according to the embodiment is favorable as a solar cell required to have transparency, in addition to the application to the multi-junction solar cell.

When the aperture ratio of the dot region 4 ([the area of the region on which the dots are provided]/[the area of the first electrode 2]) is high, the dot region 4 is excellent in transparency. The function for preventing the oxidization of the light-absorbing layer 3, occurs with even the aperture ratio excessively high. The specific aperture ratio of the dot region 4 is preferably 50 to 99.95%. The aperture ratio less than 50% is unfavorable because the translucency decreases. The aperture ratio is denoted with two significant digits (rounding off) when less than 99%, and is denoted with three or four significant digits (rounding off) when 99% or more. When the aperture ratio exceeds 99.95%, the effect of preventing the oxidization of the light-absorbing layer 3 due to the presence of the dot region 4, is hardly observed so that the dot region 4 barely contributes to the improvement of the conversion efficiency. The aperture ratio is more preferably 61 to 99.95% or 80 to 99.95%. Why the dot region 4 has the function of preventing the oxidization even when the above high aperture ratio is provided, is because it can be thought that the dots are dispersed and are interposed between the light-absorbing layer 3 and the first electrode 2 so as to inhibit an oxide film from being formed. When contact resistance occurs between the compound semiconductor and the first electrode 2, conduction through the dots having low resistance becomes dominant at the interface and additionally the oxide film is barely formed on the portion to which the dots are provided, so that a favorable contact is formed. Therefore, currents gather onto the portion of the dots so that the dot region 4 effectively functions with the high aperture ratio retained.

The dots preferably include a material that does not react on the light-absorbing layer 3 or a material that barely reacts on the light-absorbing layer 3. Thus, the dots preferably include at least one selected from the group consisting of metal, alloy, and conductive oxide. When the light-absorbing layer 3 includes Se or S, the material included in the dots desirably endures corrosion due to the Se or the S. The metal preferably includes a precious-metal-based element or Mo. Thus, the metal or metal included in the alloy for the dots desirably includes at least one selected from the group consisting of Mo, Ru, Rh, Pd, Ag, Ir, and Pt. The conductive oxide desirably includes at least one selected from the group consisting of $RuO_2$, PdO, $Rh_2O_3$, $PtO_2$, and $IrO_2$ in terms of durability against the Se and the S. The metal is preferably capable of being in ohmic connection with the light-absorbing layer 3. The metal and the compound (oxide) each preferably have a deep work function. The metal and the compound (oxide) each preferably have a work function of 5.4 eV or more. Accordingly, the dots preferably include at least one selected from the group consisting of Mo, Pt, Ir, and Pd. The dots may include one element or a combination of at least two elements of the materials.

The shape of each dot is not particularly limited. Specific examples of the shape of each dot include a circle, an ellipse, and a polygon. The circle, the ellipse, and the polygon may have, but are not particularly limited to, a hollow (e.g., an O type) or an opening (e.g., a C type or a bracket shape). The size of each dot is preferably 2 nm to 20 μm. The size of each dot (the diameter) is more preferably 6 nm to 10 μm. The dots excessively small are difficult to disperse on the surface of the first electrode 2. The dots excessively large are unfavorable because variation occurs in translucency or the light-absorbing layer 3 is easily oxidized. The height of each dot in the dot region 4 is preferably, but is not particularly limited to, 2 nm to 50 μm in terms of easy preparation. When the mobility of the light-absorbing layer 3 is not much high, using the dots having a hollow shape with a hole is preferable in that the interval between the metals can shorten and additionally the aperture ratio can increase. When the dots are formed on the first electrode 2 by coating and drying a solution including metal particles, the metal particles partially may aggregate.

Preferably, the dots disperse so as to be interposed between the light-absorbing layer 3 and the first electrode 2.

Thus, the dot region 4 preferably collectively satisfies the aperture ratio described above.

Figure 2:
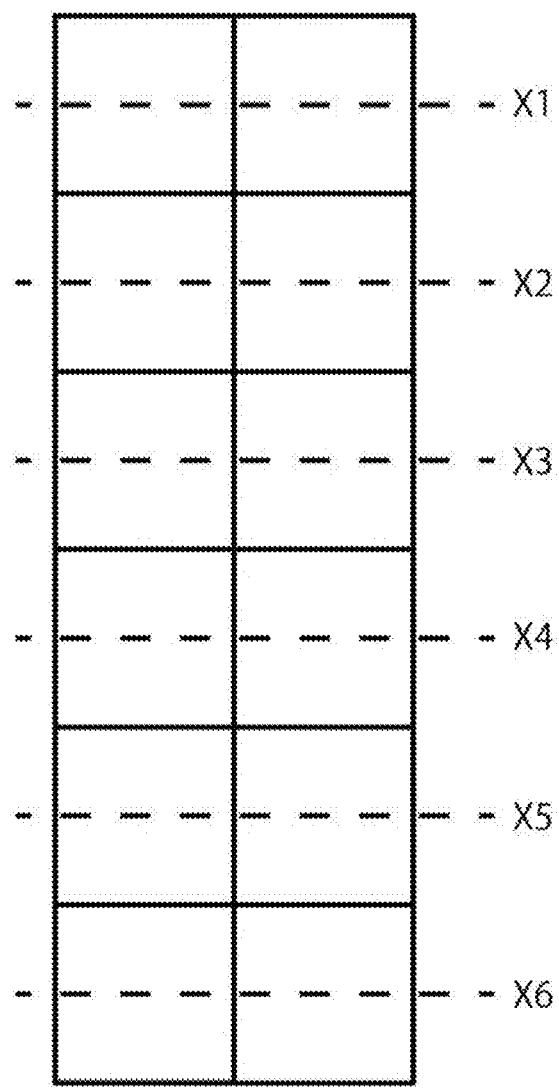
FIG. 2 is an imaged view according to the first embodiment.
Figure 3:
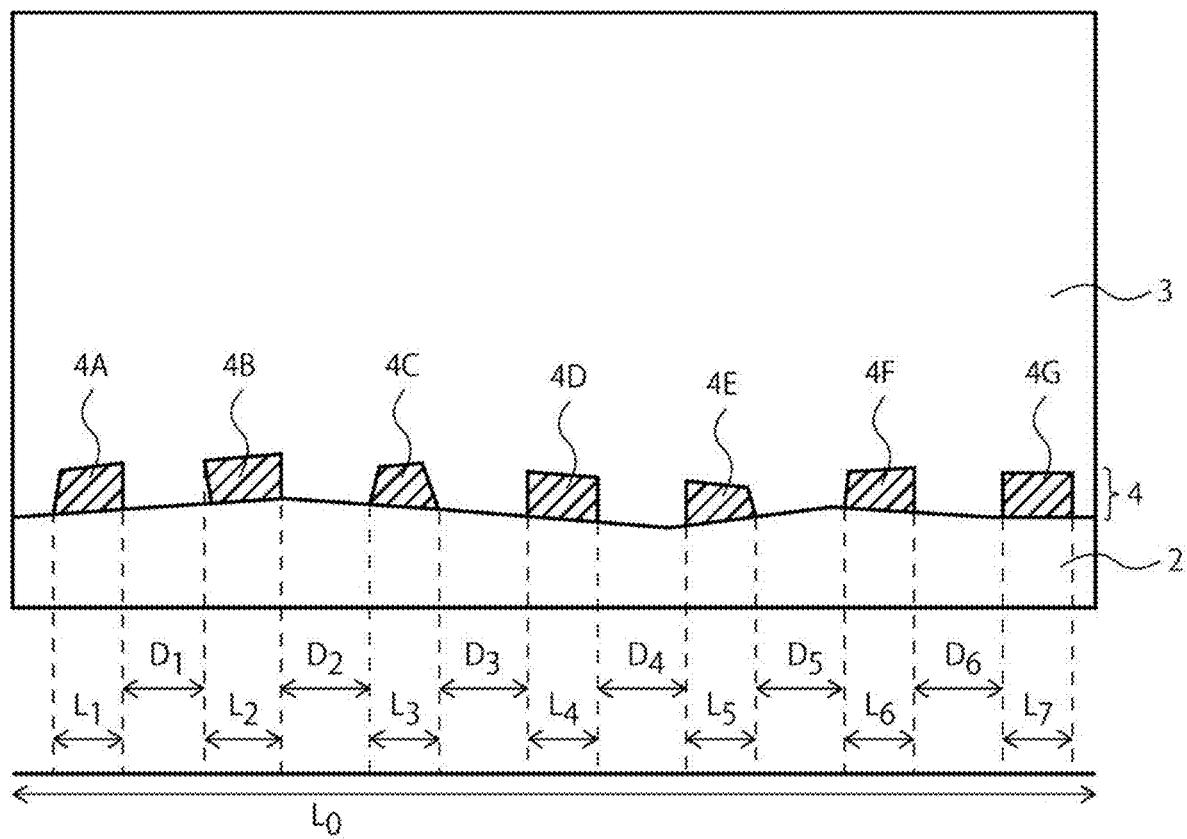
FIG. 3 is another imaged view according to the first embodiment.

A surface of the light-absorbing layer 3 facing the first electrode 2, is equally divided into 12 regions (two in width and six in length) in a lattice pattern as illustrated in an imaged view of FIG. 2. Then, a section of each region including a center is observed by a scanning electron microscope (SEM) at a magnification of 40 k times. The surface is divided into six in a longitudinal direction and then into two in a lateral direction. When the shape of the surface is square, the surface may be divided into six in width or in length. Each section to be observed is a surface including the light-absorbing layer 3, the dot region 4, and the first electrode 2 in a direction vertical to the surface of the light-absorbing layer 3 facing the first electrode 2. Furthermore, the twelve sections to be observed all are sections in the same direction, similarly to sections on apparent lines X1 to X6 in FIG. 2. The angle of each line passing through the center of a corresponding lattice region, is arbitrarily selected so that the dot region 4 can be observed. The surface on which seven dots in the dot region 4 can be ascertained by a SEM image, is observed. A region of $6 \times 10^{-6}$ mm$^2$ in the surface to be observed is observed and then a SEM image illustrated in an imaged view of FIG. 3 is acquired. As illustrated in the imaged view of FIG. 3, each dot in the dot region 4 is projected to the side of the first electrode 2 (4A, 4B, 4C, 4D, 4E, 4F, and 4G in FIG. 3). The lengths of the respective dots that have been projected, are defined to be $L_1, L_2 \ldots$ and $L_n$ ($L_1$ to $L_7$ in FIG. 3). $L_1$ to $L_n$ are defined to be the sizes of the dots. The width of the first electrode 2 in the surface to be observed is defined to be $L_0$. The sum of $L_1$ to $L_n$ is defined to be $L_S$. When an aperture ratio acquired by $(L_S/L_0)^2$ satisfies the aperture ratio described above, the dot region 4 satisfies the aperture ratio described above. That is, the following expression is preferably satisfied: $50 \leq (L_S/L_0)^2 \leq 99.5\%$ The following expression is more preferably satisfied: $61 \leq (L_S/L_0)^2 \leq 99.5\%$ The following expression is further preferably satisfied: $80 \leq (L_S/L_0)^2 \leq 99.5\%$ A state where all the twelve sections satisfy the aperture ratio, is more preferable. The state is that the dot region 4 collectively satisfies the aperture ratio. When seven dots cannot be ascertained in the dot region 4 in a SEM observation image, the magnification is appropriately changed and, in some cases, transmission electron microscope (TEM) observation is performed.

The difference between the respective dots in size is preferably small. Here, the average value of $L_1, L_2 \ldots$ and $L_n$ is defined to be $L_{AVE}$. The maximum value in $L_1, L_2 \ldots$ and $L_n$ is defined to be $L_{MAX}$. The minimum value in $L_1, L_2 \ldots$ and $L_n$ is defined to be $L_{MIN}$. In this case, when the following expression is satisfied: $0.8\ L_{AVE} \leq L_{MIN} \leq L_{MAX} \leq 1.2\ L_{AVE}$, the minimum value and the maximum value of the dots in size in the dot region 4 in are 0.8 to 1.2 times the average value of the dots in size, and are preferable. Similarly, when the following expression is satisfied: $0.9\ L_{AVE} \leq L_{MIN} \leq L_{MAX} \leq 1.1\ L_{AVE}$, the minimum value and the maximum value of the dots in size in the dot region 4 are 0.9 to 1.1 times the average value of the dots in size, and are more preferable. The difference between the respective dots in size in all the twelve sections is preferably small. The state is that the dot region 4 collectively satisfies the condition in which the difference between the dots in size is small.

Unevenly distributing the dots unfavorably makes the translucency low in a region including a large number of the dots and makes the surface of the light-absorbing layer 3 facing the first electrode 2, easily oxidized in a region including a small number of the dots. Thus, the difference between dot intervals in the dot region 4 is preferably small. A minimum value and a maximum value of the dot intervals in the dot region 4 are preferably 0.8 to 1.2 times an average value of the dot intervals. The minimum value and the maximum value of the dot intervals in the dot region 4 are more preferably 0.9 to 1.1 times the average value of the dot intervals. The variation between the dot intervals will be described with the imaged view in FIG. 3. A SEM image used in acquiring each dot interval is the same as a SEM image for acquiring the aperture ratio. Each dot in the dot region 4 (4A, 4B, 4C, 4D, 4E, 4F, and 4G in FIG. 3) are projected to the side of the first electrode 2. Distances between portions $L_1, L_2 \ldots$ and $L_n$ that have been projected ($L_1$ to $L_7$ in FIG. 3) are defined to be $D_1, D_2, \ldots$ and $D_n$ ($D_1$ to $D_6$ in FIG. 3). The average value of $D_1, D_2, \ldots$ and $D_n$ is defined to be $D_{AVE}$. The maximum value in $D_1, D_2, \ldots$ and $D_n$ is defined to be $D_{MAX}$. The minimum value in $D_1, D_2, \ldots$ and $D_n$ is defined to be $D_{MIN}$. In this case, when the following expression is satisfied: $0.8\ D_{AVE} \leq D_{MIN} \leq D_{MAX} \leq 1.2\ D_{AVE}$, the minimum value and the maximum value of the dot intervals in the dot region 4 are 0.9 to 1.1 times the average value of the dot intervals. Similarly, when the following expression is satisfied: $0.9\ D_{AVE} \leq D_{MIN} \leq D_{MAX} \leq 1.1\ D_{AVE}$, the minimum value and the maximum value of the dot intervals in the dot region 4 are 0.8 to 1.2 times the average value of the dot intervals. Each dot interval is preferably 0.8 nm to 24 μm in terms of the above point. In this manner, when the dots are evenly distributed, the variation is small in light transmittance and the optical properties of the solar cell 100 improve. In a case where the dots each have the same aperture ratio and the same size, more evenly distributing the dots improves the function of preventing the oxidization of the light-absorbing layer 3 and thus is preferable. This is because it can be thought that the oxidization easily progresses in a region including an excessively small number of the dots or in a region including no dots, and providing even a few dots inhibits the formation of the oxide film so that the conversion efficiency improves. Therefore, a state where the dot interval described above is satisfied in all the twelve sections, is also preferable. The state is that the dot region 4 collectively satisfies the dot interval described above.

The dot region 4 can be formed by a method of coating and drying a liquid including metal particles to be the dots, a method of producing a metal film, an oxide film, or a nitride film and then processing an arbitrary dot pattern with a mask, or performing imprinting with a mold having a dot pattern.

The average diameter of the dots in the clot region 4 in an in-plane direction, is preferably smaller than the average crystal grain size of the light-absorbing layer 3 in the in-plane direction at an interface on the side of the first electrode 2, and is desirably smaller than the crystal size of the compound semiconductor included in the light-absorbing layer 3. Accordingly, transfer of generated electric charge to the clot region 4 and collection are completed in a crystal in which the electric charge has been generated so that current degradation due to recombination deactivation of the electric charge at a crystal grain boundary and a voltage drop due to grain boundary passage can be avoided.

Figure 4:
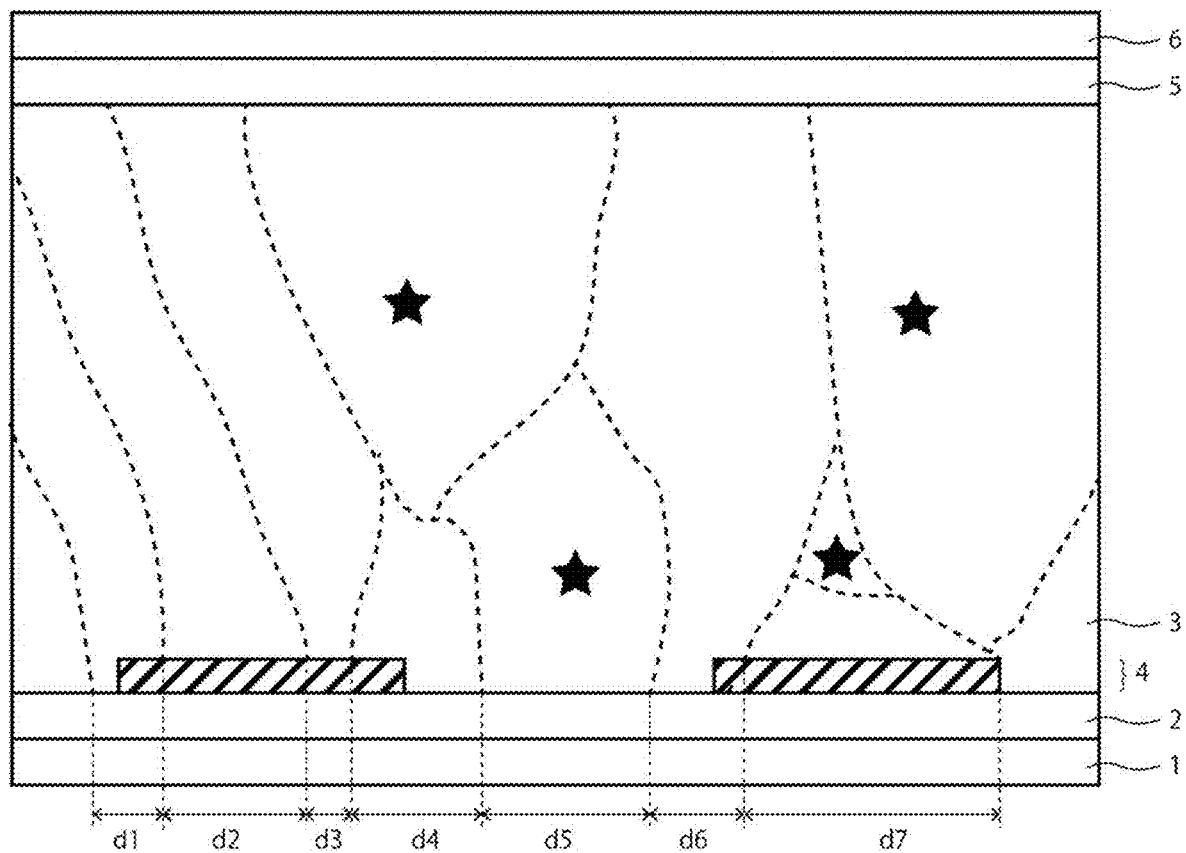
FIG. 4 is a sectional conceptual view of a solar cell according to a second embodiment.
Figure 5:
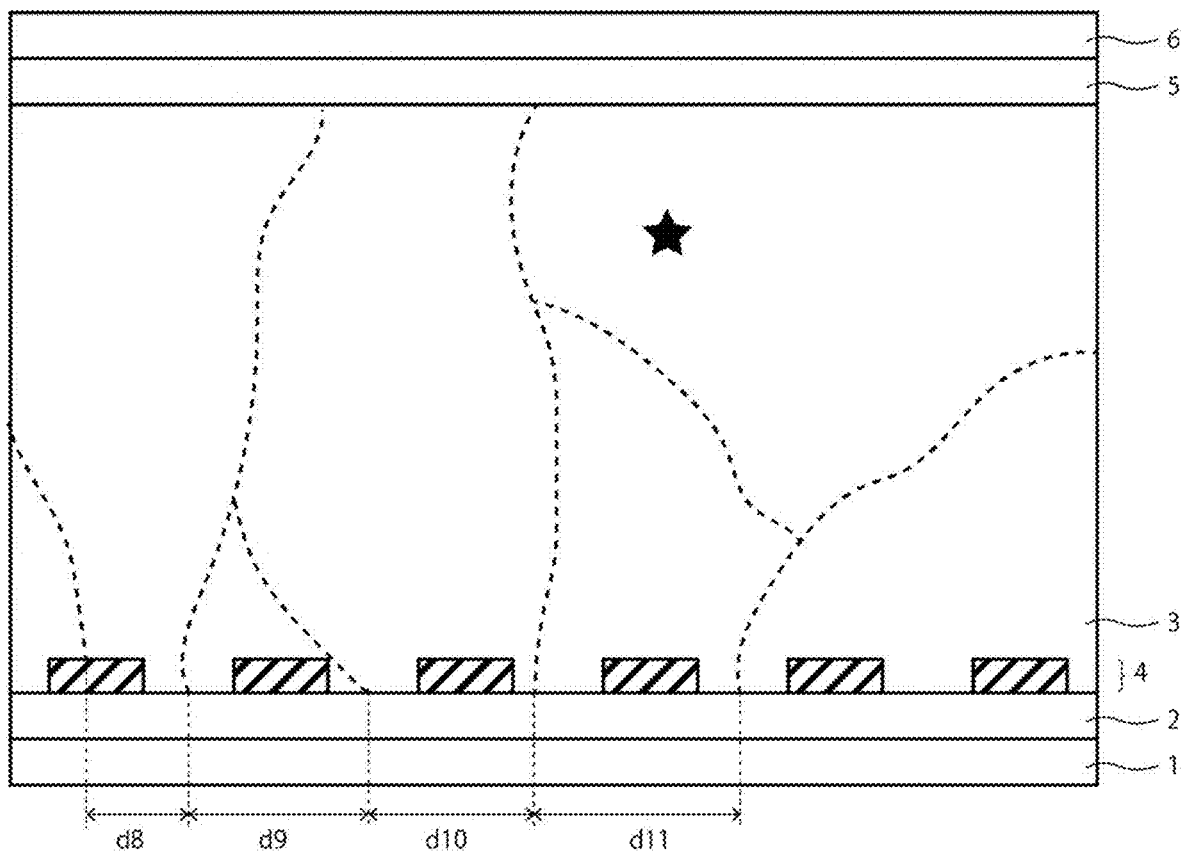
FIG. 5 is a sectional conceptual view of a solar cell according to a second embodiment.

FIGS. 4 and 5 illustrate sectional conceptual views of the solar cell 100 according to the embodiment. The conceptual view in FIG. 4 illustrates the solar cell 100 including the average diameter of the dots in the dot region 4 in the in-plane direction larger than the average crystal grain size of the light-absorbing layer 3 in the in-plane direction at the interface on the side of the first electrode 2. The conceptual view in FIG. 5 illustrates the solar cell 100 including the average diameter of the dots in the dot region 4 in the in-plane direction smaller than the average crystal grain size of the light-absorbing layer 3 in the in-plane direction at the interface on the side of the first electrode 2. The average diameter of the dots in the dot region 4 in the in-plane direction and the average crystal grain size of the light-absorbing layer 3 in the in-plane direction at the interface on the side of the first electrode 2, are acquired from a SEM image the same as the SEM image for acquiring the aperture ratio. The average diameter of the dots in the dot region 4 in the in-plane direction, is the average value of the respective lengths of the dots in a width direction in the SEM image. The average crystal grain size of the light-absorbing layer 3 in the in-plane direction at the interface on the side of the first electrode 2, is the average value of the lengths of crystals of the light-absorbing layer 3 in the width direction at the interface on the side of the first electrode 2 in the SEM image (e.g., d1 to d7 and d8 to d11 in the conceptual views). The grain boundary of the light-absorbing layer 3 is indicated with a broken line in FIGS. 4 and 5. The crystals not in direct contact with the dots, in the light-absorbing layer 3, are each indicated with a star mark in FIGS. 4 and 5.

In comparison between FIGS. 4 and 5, the solar cell 100 illustrated in the conceptual view of FIG. 4 includes the average crystal grain size of the light-absorbing layer 3 in the in-plane direction at the interface on the side of the first electrode 2, smaller than the average diameter of the dots in the in-plane direction. Thus, the crystals not in direct contact with the dots, in the light-absorbing layer 3 are larger than those of the solar cell 100 illustrated in the conceptual view of FIG. 5 in number. A positive hole generated by power generation reaches the dot through the grain boundary of the light-absorbing layer 3 for each of the crystals not in direct contact with the dots, in the light-absorbing layer 3. When the positive hole passes through the grain boundary, recombination deactivation and a voltage drop occur unfavorably. When a relationship in which the average diameter of the dots in the dot region 4 in the in-plane direction is smaller than the average crystal grain size of the light-absorbing layer 3 in the in-plane direction at the interface on the side of the first electrode 2, is satisfied, an advantage is acquired that power generated in the light-absorbing layer 3 can be effectively transmitted.

The average diameter of the dots in the dot region 4 in the in-plane direction, is desirably approximately hundreds nm. In a case where a solar cell is formed with a multi-junction, light having a wavelength not absorbed in a solar cell having a first photoelectric conversion portion referred to as a top cell, is required to pass on to a solar cell having a second photoelectric conversion portion referred to as a bottom cell. In order to increase the light transmittance of the top cell, an aperture ratio is required at least to increase with a dot region reduced in size. In that case, the collection region of electric charge is reduced, resulting in a decrease in output of the solar cell. However, in a case where dots each having a size substantially the same as or smaller than an incident wavelength of hundreds nm, the light transmittance does not degrade large even when the aperture ratio increases. Therefore, the size of each dot is desirably made to be substantially the same or less than a wavelength to be transmitted.

Figure 6:
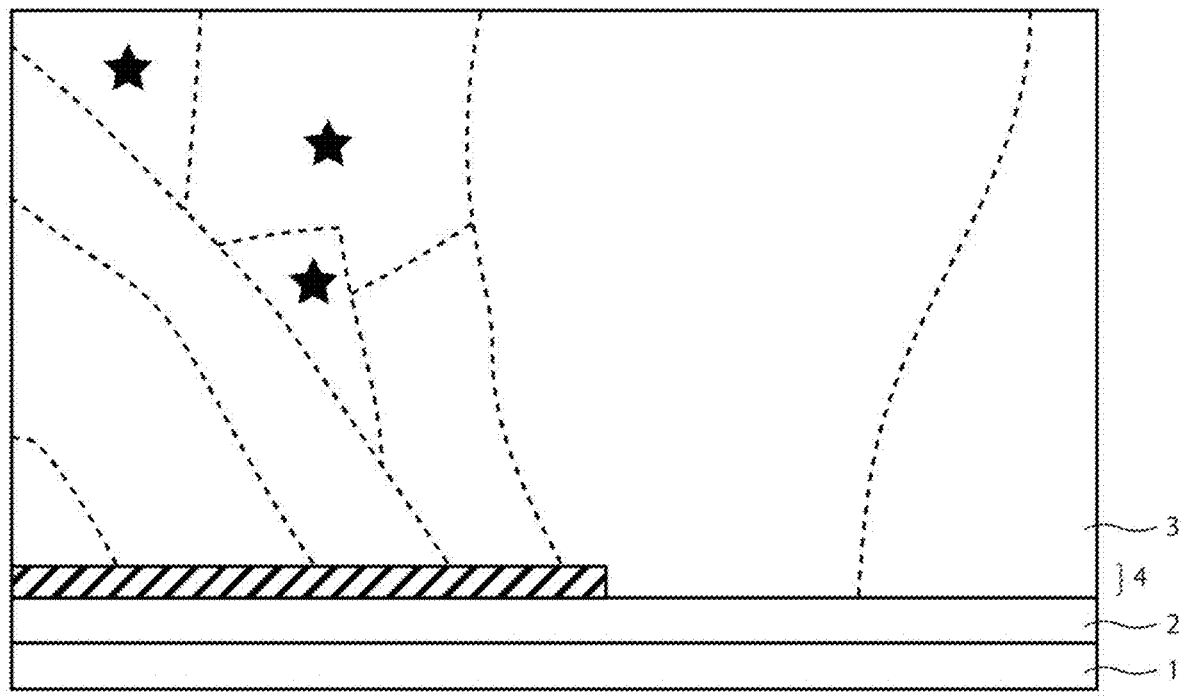
FIG. 6 is a sectional conceptual view of a solar cell according to a second embodiment.
Figure 7:
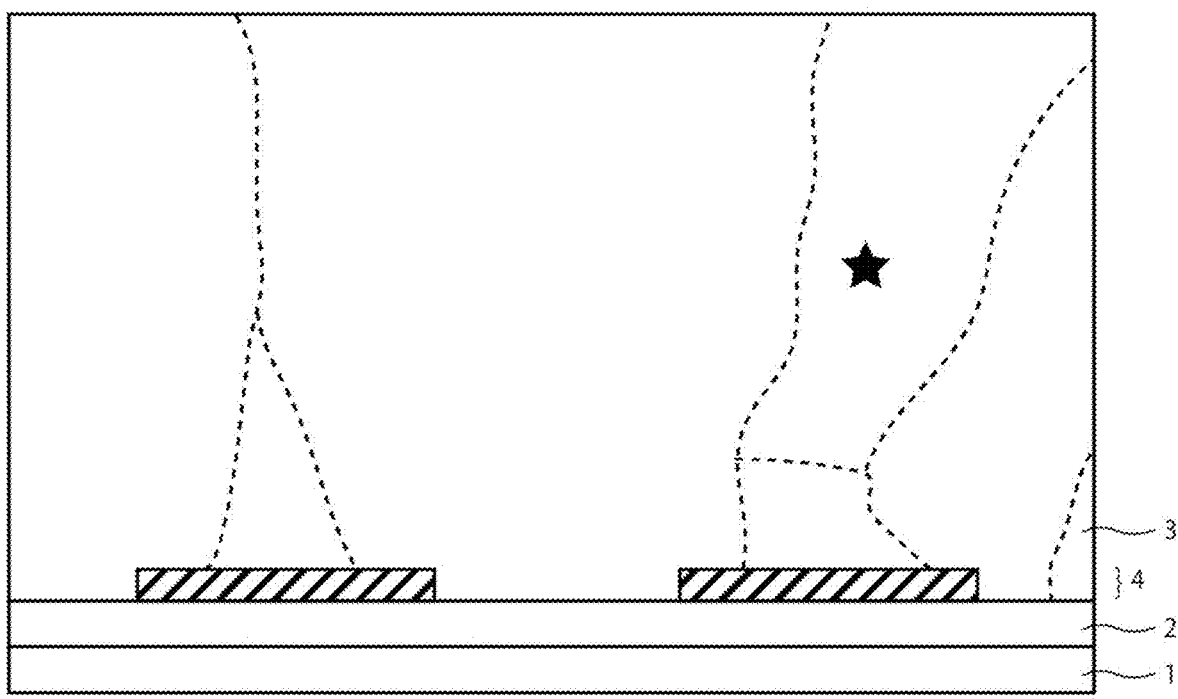
FIG. 7 is a sectional conceptual view of a solar cell according to a second embodiment.

FIGS. 6 and 7 illustrate enlarged partial sectional conceptual views of the solar cell 100 according to the embodiment. Depending on the material included in the dot region 4, an element that diffuses from a lower substrate, may be blocked. Accordingly, degradation of the light-absorbing layer 3 in performance and inhibition of the light-absorbing layer 3 in formation occur. In contrast to this, the size of each dot is made to be approximately hundreds nm so that the element diffuses above the dot region 4 from the region in which no dot is present. Thus, the inhibition of the light-absorbing layer 3 in formation is solved.

FIG. 6 illustrates a conceptual view when the average diameter of the dots in the dot region 4 in the in-plane direction is large, for example, 200 nm or more. In the conceptual view illustrated in FIG. 6, the crystals of the light-absorbing layer 3 tend to be small on the dots and the crystals of the light-absorbing layer 3 tend to be large on the first electrode 2 (the transparent electrode). It has been confirmed that the crystals of the light-absorbing layer 3 tend to grow along the dots. The crystals on the first electrode 2 each have a large grain size and additionally tend to come in direct contact with the dots. Meanwhile, the crystals of the light-absorbing layer 3 on the dots each have a smaller grain size than the crystals on the first electrode 2. When the number of the crystals having the small grain size, is large, the grain boundary increases in quantity and power generation efficiency degrades with the reason described above.

FIG. 7 illustrates a conceptual view when the average diameter of the dots in the dot region 4 in the in-plane direction is small, for example, 100 nm or less. In the conceptual view illustrated in FIG. 7, the crystals of the light-absorbing layer 3 tend, to be small on the dots and the crystals of the light-absorbing layer 3 tend to be large on the first electrode 2 (the transparent electrode), similarly to those illustrated in the conceptual view of FIG. 6. It has been confirmed that the crystals of the light-absorbing layer 3 tend to grow along the dots. The crystals on the first electrode 2 each have a large grain size and tend to come in direct contact with the dots. Meanwhile, the crystals of the light-absorbing layer 3 on the dots each have a smaller grain size than the crystals on the first electrode 2. When the number of the crystals having the small grain size, is large, the grain boundary increases in quantity and power generation efficiency degrades with the reason described above. A mode illustrated in the conceptual view of FIG. 7 is preferable in that the ratio of the crystals having the large grain size is high since the dots are small in size. As long as the aperture ratio is the same, the ratio of the dots smaller in size in direct contact with each crystal, increases so that the ratio of the positive hole that moves through the grain boundary, can be reduced. When the dots are small in size as illustrated in FIG. 7, the crystals of the light-absorbing layer 3 each have a large grain size so that an effect on inhibition of recombination activation and prevention of the voltage drop, is acquired. In FIGS. 6 and 7, the grain boundary of the light-absorbing layer 3 is indicated with a broken line. In FIGS. 6 and 7, the crystals of the light-absorbing layer 3 not in direct contact with the dots, each are indicated with a start mark.

Therefore, when the average diameter of the dots in the in-plane direction is 100 nm or less, the crystal quality of the light-absorbing layer 3, namely, the crystals of the light-absorbing layer 3 each preferably have the large grain size in terms of improvement of the crystal quality of the light-absorbing layer 3 and the power generation efficiency. For example, in a case where the material included in the dot region 4 includes molybdenum, it is considered that the crystals to grow on the dot region 4 each can include a crystal having a large grain size due to the element diffusing from an area outside the dot region 4. In consideration of the above, the average diameter of the dots in the in-plane direction is preferably 2 to 100 nm, more preferably, 6 to 50 nm. (n-Type Layer)

The n-type layer 5 according to the embodiment is an n-type semiconductor layer. The n-type layer 5 is interposed between the light-absorbing layer 3 and the second electrode 6. The n-type layer 5 is a layer in direct contact with a surface of the light-absorbing layer 3 on the side opposite to the other surface thereof facing the first electrode 2. The n-type layer 5 is a layer in heterojunction with the light-absorbing layer 3. The n-type layer 5 is preferably an n-type semiconductor having a Fermi level controlled to achieve a photoelectric conversion element having a high open voltage. For example, $Zn_{1-y}M_yO_{1-x}S_x$, $Zn_{1-y-z}Mg_zM_yO$, $ZnO_{1-x}S_x$, $Zn_{1-z}Mg_zO$ (M is at least one element selected from, the group consisting of: B, Al, In, and Ga) or CdS can be used for the n-type layer 5. The thickness of the n-type layer 5 is preferably 2 to 800 nm. The n-type layer 5 is produced by, for example, sputtering or chemical bath deposition (CBD). When produced, by the CBD, for example, the n-type layer 5 can be formed on the light-absorbing layer 3, by a chemical reaction between a metallic salt (e.g., $CdSO_4$), a sulfide (thiourea), and a complexing agent (ammonia) in a solution. When a chalcopyrite compound with a group IIIb element including no In, such as a $CuGaSe_2$ layer, an $AgGaSe_2$ layer, a $CuGaAlSe_2$ layer, or $CuGa(Se, S)_2$ layer, is used for the light-absorbing layer 3, CdS is preferable as the n-type layer 5.

(Oxide Layer)

The oxide layer according to the embodiment is a thin film preferably provided between the n-type layer 5 and the second electrode 6. The oxide layer is a thin film including any compound of $Zn_{1-x}Mg_xO$, $ZnO_{1-y}S_y$, and $Zn_{1-x}Mg_xO_{1-y}S_y$ ($0 \leq x$, $y < 1$). A mode including the oxide layer not necessarily covering an entire surface of the n-type layer 5 facing the side of the second electrode 6, may be provided. For example, the oxide layer at least covers 50% of the surface of the n-type layer 5 on the side of the second electrode 6. Other examples include Wurtzite-type AlN, GaN, and BeO. When the volume resistivity of the oxide layer is 1 Ωcm or more, the oxide layer has an advantage in that a leak current resulting from a low resistance component possibly present in the light-absorbing layer 3 can be inhibited. Note that, according to the embodiment, the oxide layer can be omitted. The oxide layer is an oxide particle layer, and preferably has a large number of cavities inside. The intermediate layer is not limited to the compounds and the physical properties thereof, and is at least a layer that contributes to, for example, improvement of the conversion efficiency of the solar cell 100. The intermediate layer may include a plurality of layers each having different physical properties.

(Second Electrode)

The second electrode 6 according to the embodiment is an electrode film allowing light, such as sunlight, to pass therethrough and having conductivity. The second electrode 6 is in direct contact with a surface of the intermediate layer or the n-type layer 5 on the side opposite to the other face thereof facing the side of the light-absorbing layer 3. The light-absorbing layer 3 and the n-type layer 5 joined together are interposed between the second electrode 6 and the first electrode 2. The second electrode 6 is produced by performing sputtering in an Ar atmosphere, for example. For example, ZnO:Al including a ZnO target containing alumina ($Al_2O_3$) in an amount of 2 wt % or ZnO:B having a dopant being B from diborane or triethylboron, can be used for the second electrode 6.

(Third Electrode)

A third electrode according to the embodiment is an electrode of the solar cell 100, and a metal film formed on a face of the second electrode 6 on the side opposite to the other face thereof facing the side of the light-absorbing layer 3. A conductive metal film, such as Ni or Al, can be used as the third electrode. The film thickness of the third electrode is, for example, 200 to 2000 nm. When a resistance value of the second electrode 6 is low and a series resistance component can be negligibly small, the third electrode can be omitted.

(Antireflection Film)

An antireflection film according to the embodiment, is a film for facilitating light to be introduced into the light-absorbing layer 3, and is formed on a face of the second electrode 6 or a face of the third electrode on the side opposite to the other face thereof facing the side of the light-absorbing layer 3. For example, $MgF_2$ or $SiO_2$ is preferably used as the antireflection film. Note that, according to the embodiment, the antireflection film can be omitted. The film thickness is required to be adjusted in response to a refractive index of each layer, and vapor deposition is preferably performed in an amount of 70 to 130 nm (preferably, 80 to 120 nm).

Second Embodiment

Figure 8:
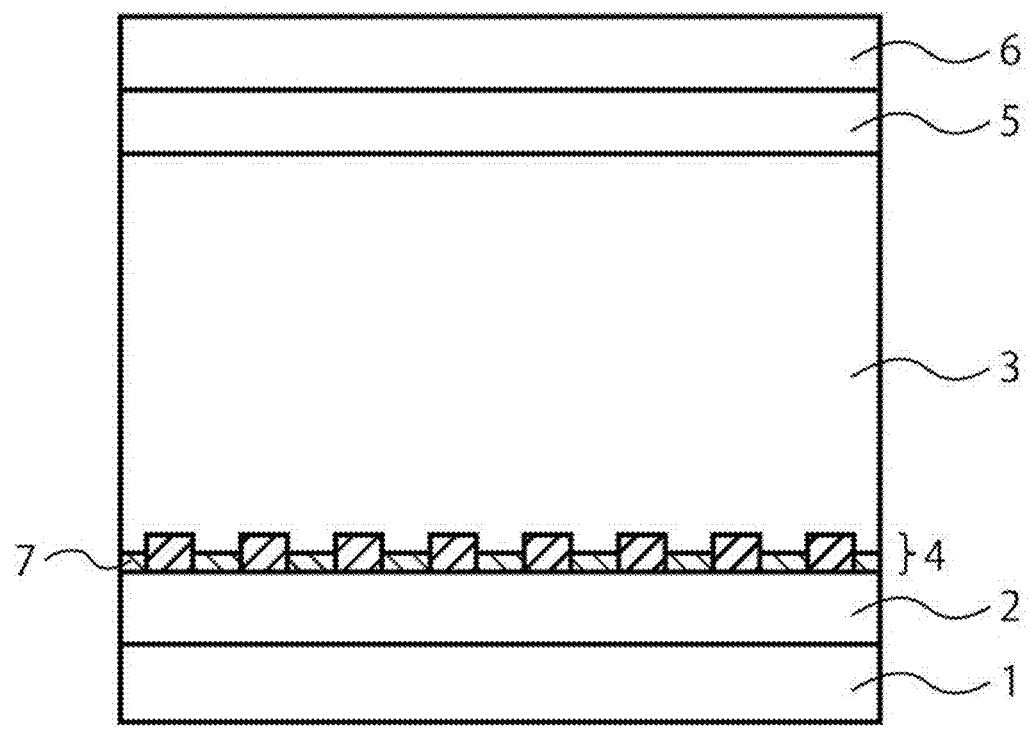
FIG. 8 is a sectional conceptual view of a solar cell according to a second embodiment.

As illustrated in FIG. 8, a solar cell 101 according to the present embodiment includes a substrate 1 and a first electrode 2 on the substrate 1. A light-absorbing layer 3 and an n-type layer 5 are interposed between the first electrode 2 and a second electrode 6. The light-absorbing layer 3 is interposed between the first electrode 2 and the n-type layer 5. A dot region 4 is provided between the first electrode 2 and the light-absorbing layer 3. A first insulating film 7 is interposed between dots in the dot region 4. When each dot is hollow in the dot region 4, the first insulating film 7 is preferably provided in a hollow portion. The solar cell 101 is in common with the solar cell 100 according to the first embodiment, except for the first insulating film 7. The descriptions common between the first embodiment and the second embodiment will be omitted.

(First Insulating Film)

The first insulating film 7 is provided to an entire surface or a portion between the light-absorbing layer 3 and the first electrode 2 between the dots. The first insulating film 7 is a film having translucency, that prevents the light-absorbing layer 3 from oxidizing. A surface of the first electrode 2 facing the side of the light-absorbing layer 3 is in direct contact with a surface of the first insulating film 7 facing the side of the first electrode 2. A surface of the light-absorbing layer 3 facing the side of the first electrode 2 is in direct contact with a surface of the first insulating film 7 facing the side of the light-absorbing layer 3. A side surface of the first insulating film 7, namely, a surface toward the side of the dot region 4 is in direct contact with a corresponding dot or the light-absorbing layer 3. The dot region 4 can prevent the oxidization of the light-absorbing layer 3. The aperture ratio of the dot region 4 low is favorable in terms of the prevention of the oxidization, but is unfavorable because the transmittance of light degrades. A solar cell including the first insulating film 7 provided to the entire surface between the light-absorbing layer 3 and the first electrode 2, and no dot region 4 provided, makes a direct contact between the first electrode 2 and the light-absorbing layer 3 unfavorable so that the conversion efficiency does not improve. Simply introducing an insulating film makes a series resistance component (Rs) of the solar cell large so that efficiency decreases.

When the first insulating film 7 is interposed, between the light-absorbing layer 3 and the first electrode 2, electric conduction between the first electrode 2 and the light-absorbing layer 3 can be inhibited so that a fill factor FF improves and conversion efficiency improves. Examples of the first insulating film 7 include any of an oxide film and a nitride film. Specifically, the oxide film preferably includes at least one film selected from the group consisting of $AlO_x$, $SiO_x$, MgO, and $(Al, Si, Mg)O_x$. The nitride film preferably includes at least one film selected from the group of $SiN_x$, $AlN_x$, $GaN_x$, and $(Si, Al, Ga)N_x$. The thickness of the first insulating film 7 may be thicker than the height of each dot in the dot region 4, but is preferably the height of each dot or less, and, 1 to 80 nm. The thickness of the first insulating film 7 is more preferably the height of each dot or less, and, 5 to 50 nm. The first insulating film 7 has the effect even when not necessarily covering the entire surface between the light-absorbing layer 3 and the first electrode 2 between the dots. The first insulating film 7 is preferably provided to the entire surface between the light-absorbing layer 3 and the first electrode 2 between the dots in terms of the prevention of the oxidization and the improvement of the FF and additionally in terms of a film producing process.

Figure 9:
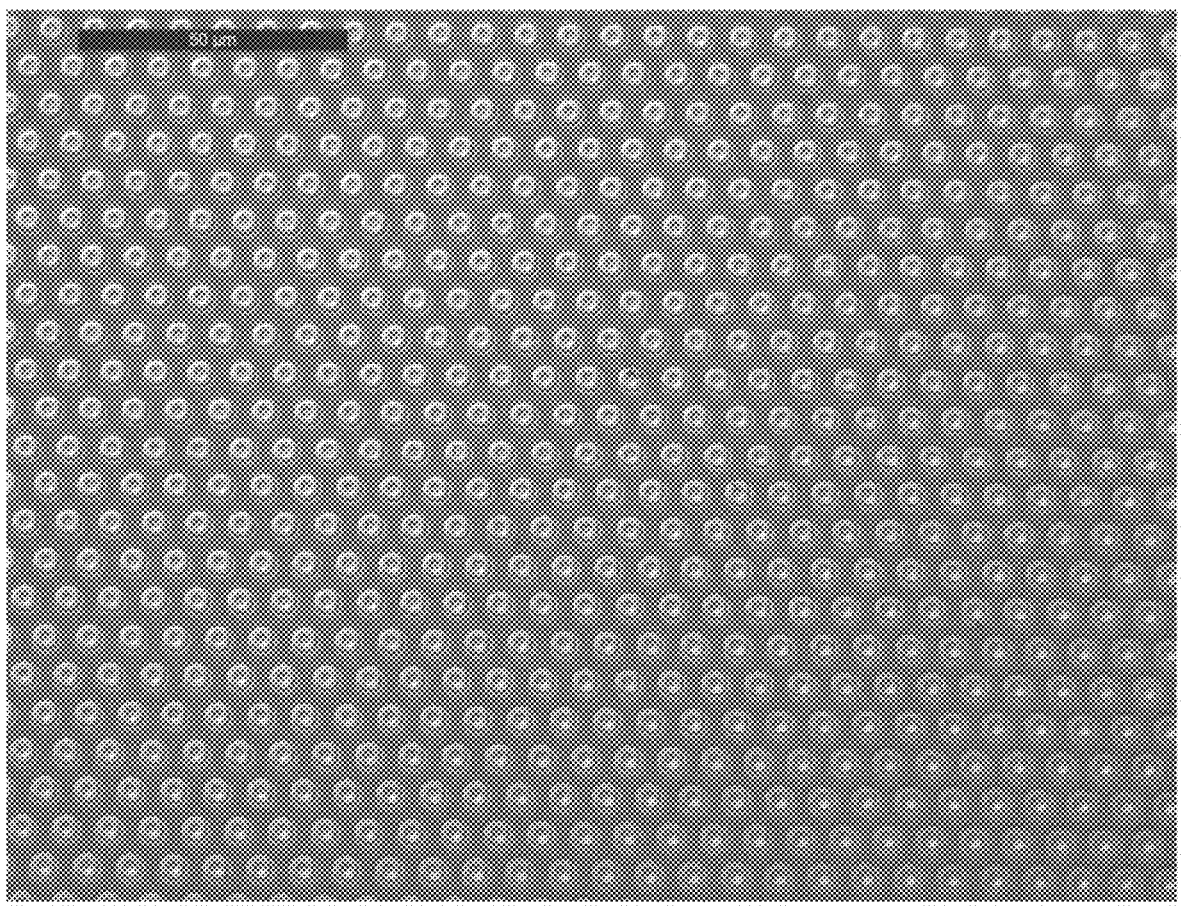
FIG. 9 is an optical microscope image according to the second embodiment.
Figure 10:
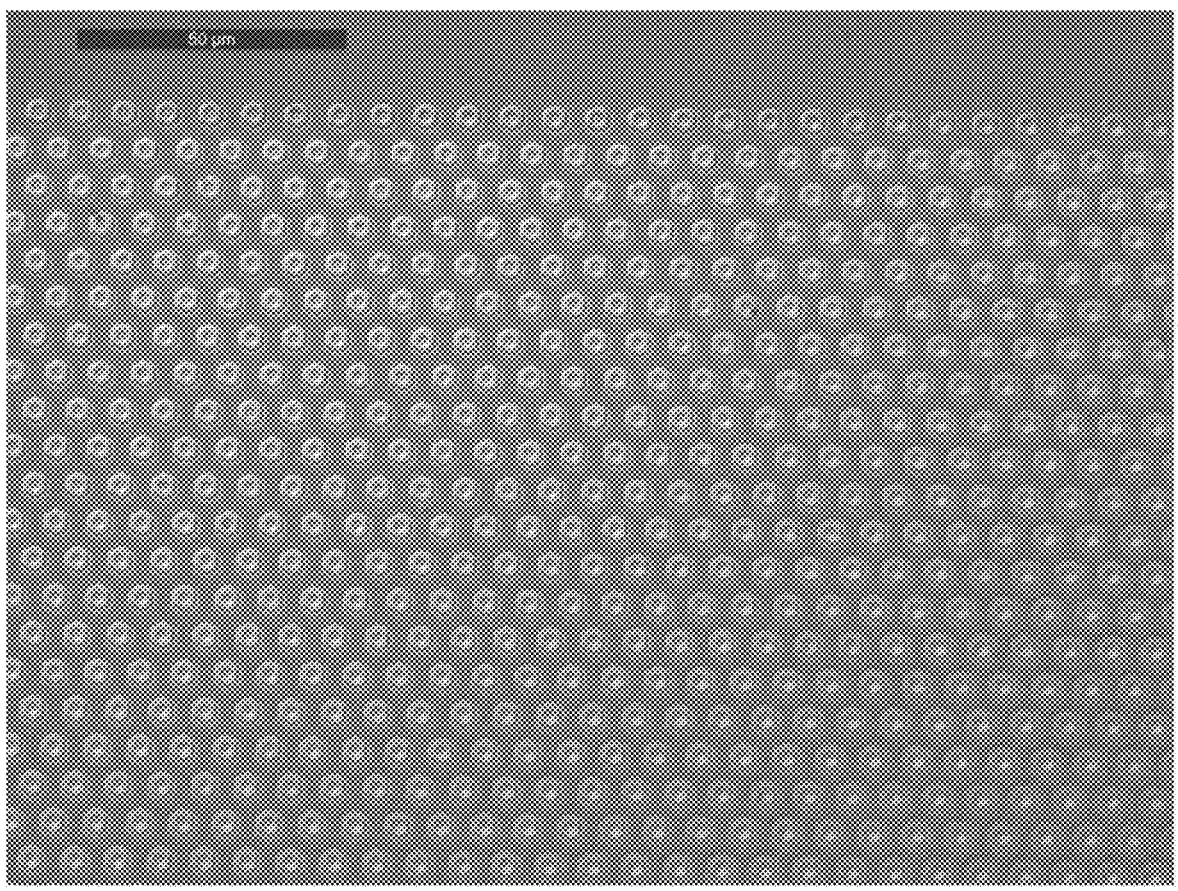
FIG. 10 is another optical microscope image according to the second embodiment.
Figure 11:
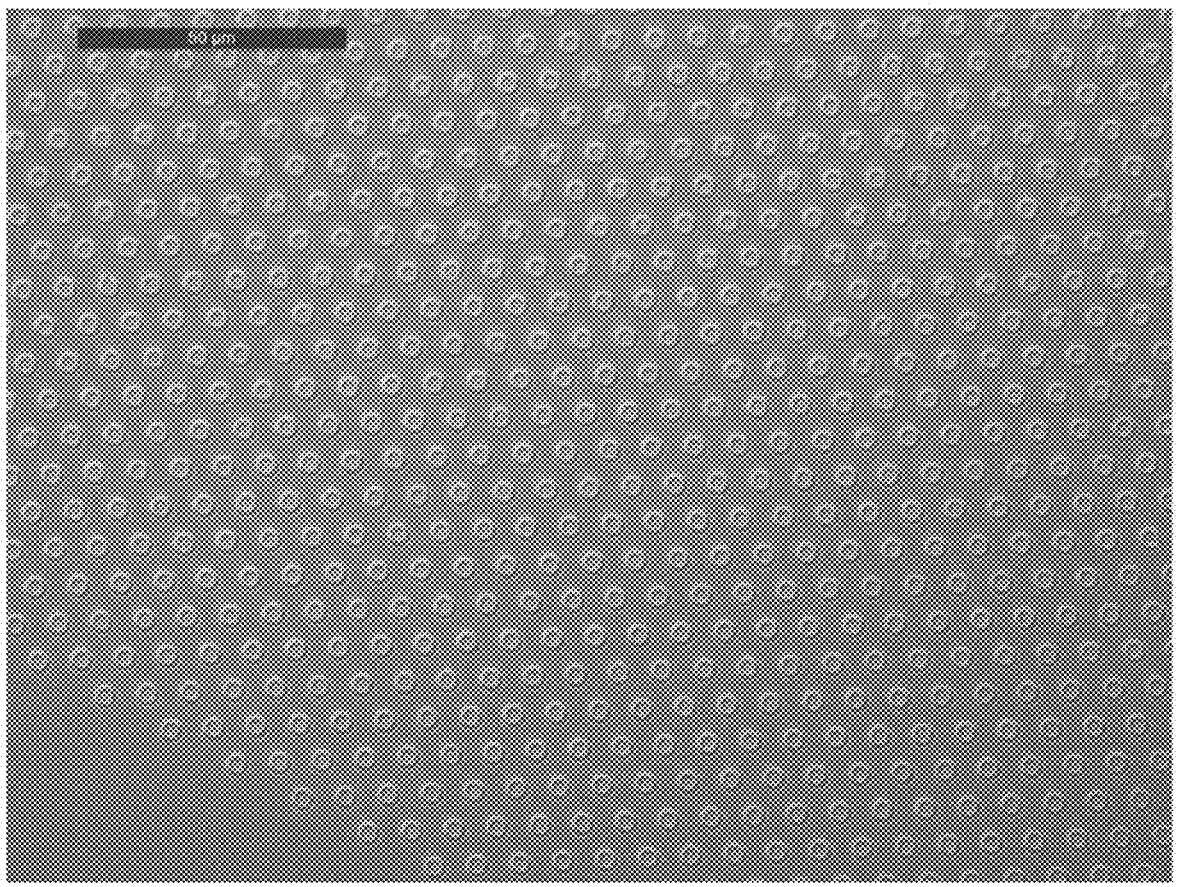
FIG. 11 is another optical microscope image according to the second embodiment.
Figure 12:
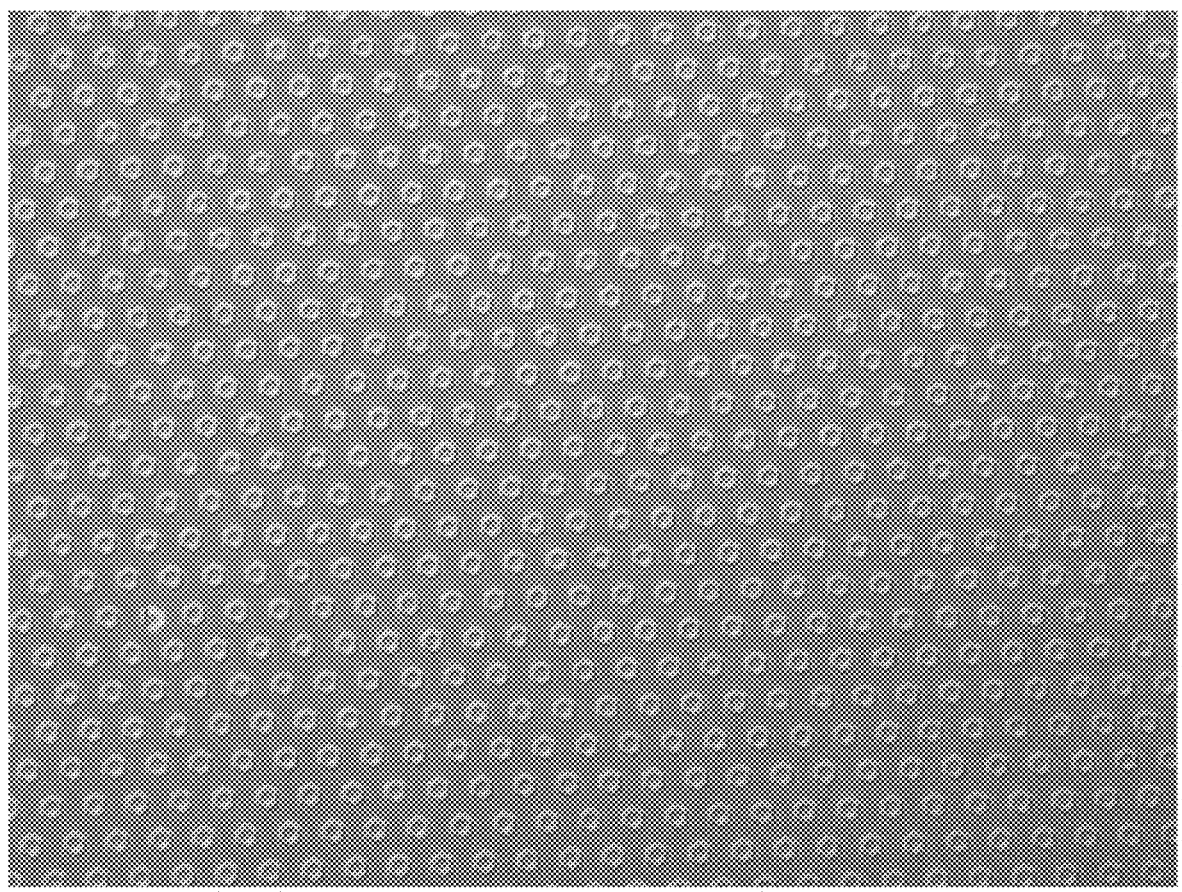
FIG. 12 is another optical microscope image according to the second embodiment.

FIGS. 9 to 12 illustrate optical microscope images each including a member having the dot region 4 and the first insulating film 7 formed on the first electrode 2. The optical microscope images in FIGS. 9 to 12 all are at the same scale. In FIG. 9, the dot region 4 includes the dots each including molybdenum, with a hollow circle (an O type) in shape, and has a dot size of 5 µm, a dot interval of 8 µm, an aperture ratio of 82%, and a height of 50 nm. In FIG. 9, $AlO_x$ having a thickness of 40 nm is formed as the first insulating film 7. FIG. 10 is the same as FIG. 9 except that the shape of each dot is a hollow hexagon (a hexagon nut type). FIG. 11 is the same as FIG. 9 except that $SiN_x$ is used as the first insulating film 7. FIG. 12 is the same as FIG. 10 except that $SiN_x$ is used as the first insulating film 7. A uniform dot pattern is formed in each of the optical microscope images. Note that, the members illustrated in FIGS. 9 to 12 each include a region having a peripheral portion partially including no dots. Making the shape of each dot hollow and arranging the dots in a uniform pattern as illustrated in FIGS. 9 and 12, is preferable in that using the hollow dots having a hole can shorten the interval between the metals and additionally can increase the aperture ratio in a case where the mobility of the light-absorbing layer 3 is not much high, regardless of whether the first insulating film 7 is provided.

A method of forming the first insulating film 7 can adopt a semiconductor manufacturing process. For example, a metal film for the dot region 4 is produced on the first electrode 2, and then the metal film is processed in a dot pattern with a resist mask so as to form the dot region 4. Subsequently, a material to be the first insulating film 7 is produced on the resist mask of the dot region 4 and an exposed surface of the first electrode 2, by sputtering, for example. The first insulating film 7 on the dot region 4 together with the resist mask is removed so that the light-absorbing layer 3 can be produced similarly to the first embodiment. Structures illustrated in FIGS. 9 to 12 are prepared by the method described above.

Third Embodiment

Figure 13:
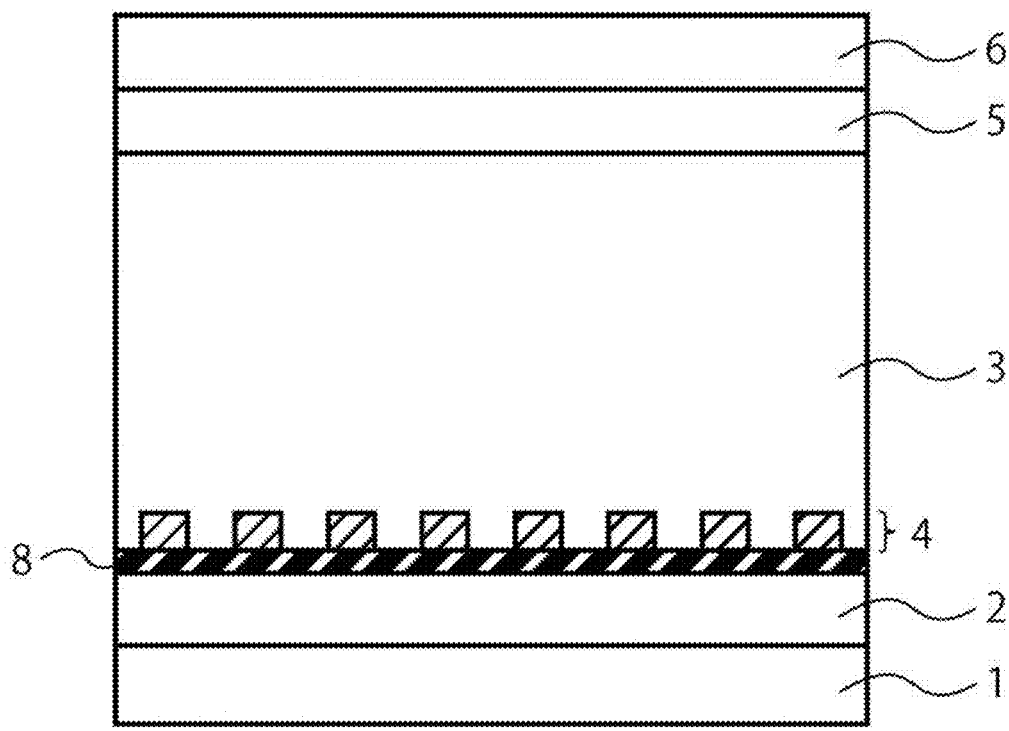
FIG. 13 is a sectional conceptual view of a solar cell according to a third embodiment.

As illustrated in FIG. 13, a solar cell 102 according to the present embodiment includes a substrate 1 and a first electrode 2 on the substrate 1. A light-absorbing layer 3 and an n-type layer 5 are interposed between the first electrode 2 and a second electrode 6. The light-absorbing layer 3 is interposed between the first electrode 2 and the n-type layer 5. A dot region 4 is provided between the first electrode 2 and the light-absorbing layer 3. A second insulating film 8 is interposed between the first electrode 2 and the dot region 4. The solar cell 102 is in common with the solar cell 100 according to the first embodiment, except for the second insulating film 8. The descriptions common between the first embodiment and the third embodiment will be omitted. Note that, the first insulating film 7 according to the second embodiment and the second insulating film 8 according to the present embodiment may be combined.

(Second Insulating Film)

The second insulating film 8 is interposed between a surface of the light-absorbing layer 3 facing the first electrode 2 and a surface of the first electrode 2 facing the light-absorbing layer 3, and between a surface of each dot of the dot region 4 facing the first electrode 2 and a surface of the first electrode 2 facing the dots of the dot region 4. The second insulating film 8 can inhibit electric conduction between the first electrode 2 and the light-absorbing layer 3 so that a fill factor FF improves and conversion efficiency improves. The second insulating film 8 thick causes resistance to be excessively high, and thus is unfavorable. The second insulating film 8 thin having, for example, a thickness of 1 to 2 nm is preferable because the second insulating film 8 becomes a tunnel insulating film so as to inhibit direct conduction between the first electrode 2 and the light-absorbing layer 3. The first insulating film 8 is produced by, for example, chemical vapor deposition (CVD).

Fourth Embodiment (Multi-Junction Solar Battery)

Figure 14:
FIG. 14 is a sectional conceptual view of a multi-junction solar cell according to a fourth embodiment.

A multi-junction solar cell according to a fourth embodiment uses the solar cell 200 according to the first embodiment. FIG. 14 is a sectional schematic view of the multi-junction solar cell according to the fourth embodiment. The multi-junction solar cell in FIG. 14 has a top cell solar cell 201 and a bottom cell solar cell 202. The solar cell 100 according to the first embodiment to the solar cell 102 according to the third embodiment are used for the top cell solar cell 201 of the multi-junction solar cell 200. For example, a solar cell having a light-absorbing layer including Si or the solar cell 100 according to the first embodiment to the solar cell 102 according to the third embodiment, each including the light-absorbing layer 3 having a bandgap narrower than that of the top cell solar cell 201, can be also used for the bottom cell 202. When the solar cell 100 according to the first embodiment is used for the top cell, preferably, the group I element includes Cu, the group III element includes Ga, and the group VI element includes Se, in terms of absorption wavelength and conversion efficiency. The light-absorbing layer 3 of the solar cell 100 according to the first embodiment is preferably used for the top cell because of the wide gap. When the solar cell 100 according to the first embodiment is used for the bottom cell, preferably, the group I element includes Cu, the group III element includes In and Ga, and the group VI element includes Se, in terms of the absorption wavelength and the conversion efficiency. According to the fourth embodiment, the multi-junction solar cell having a two-layered layer, has been described, but three solar cells or more may be layered.

Fifth Embodiment (Solar Battery Module)

The solar cells according to the first to fourth embodiments can be used as a power generation device in a solar cell module according to a fifth embodiment. Electric power generated by a solar cell according to the embodiment is consumed by a load electrically coupled to the solar cell or is stored in a storage battery electrically coupled to the solar cell.

Examples of the solar cell module according to the embodiment include a structure including a member including a plurality of solar cell cells coupled in series, in parallel, or in series and in parallel, or a structure including a single cell fixed to a supporting member, such as glass. The solar cell module may have a structure in which light received by an area larger than the area of the solar cell cells by providing a condenser is converted into electric power. The solar cell module includes the solar cells coupled in series, in parallel, or in series and in parallel.

Figure 15:
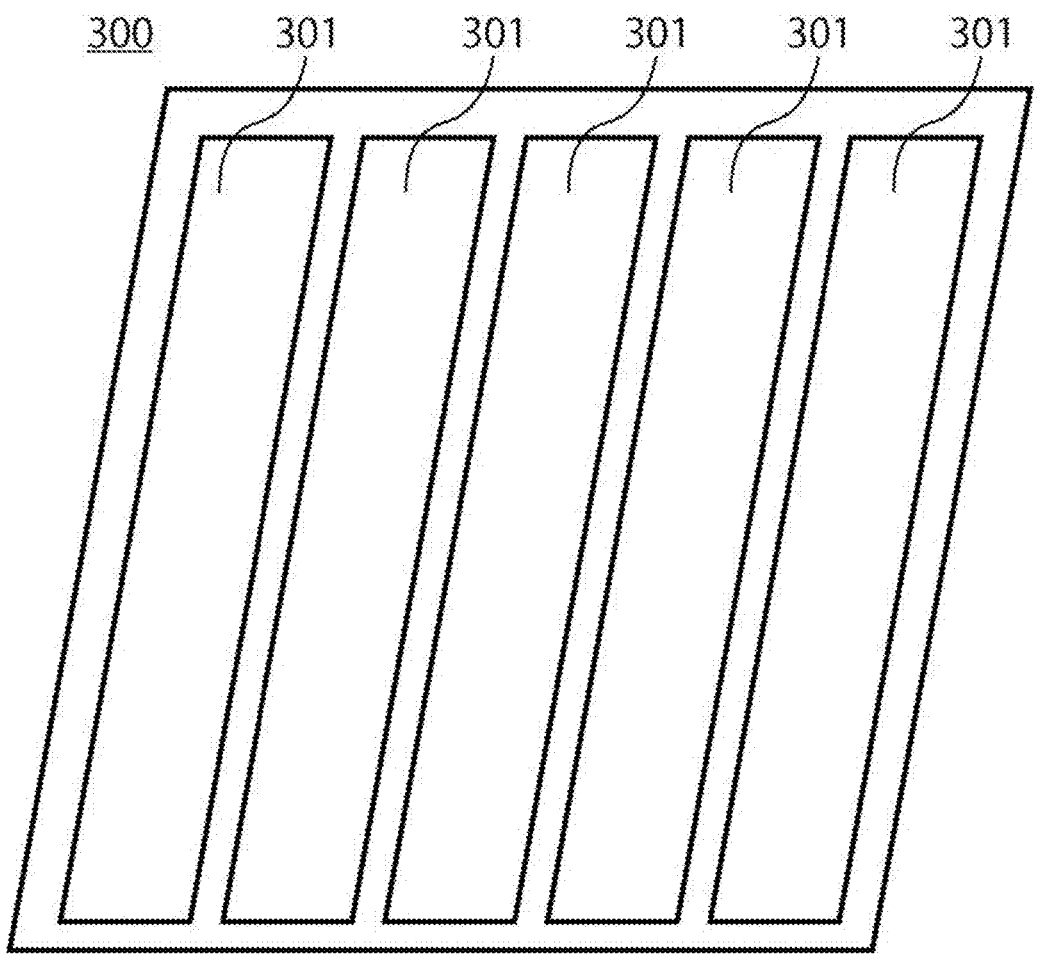
FIG. 15 is a conceptual view of a solar cell module according to a fifth embodiment.

FIG. 15 is a conceptual view of a configuration of the solar cell module 300 having the plurality of solar cells 301 arranged in a cross direction to include six cells. Although coupling wiring is omitted, the solar cell module 300 in FIG. 15 preferably includes the plurality of solar cells 301 coupled in series, in parallel, or in series and in parallel, as described above. The solar cells 100 according to the first embodiment or the multi-junction solar cells 200 according to the fourth embodiment is preferably used, for each solar cell 301. The solar cell module 300 according to the embodiment may adopt a module structure including a module including the solar cells 100 according to the first embodiment to the multi-junction solar cells 200 according to the fourth embodiment, and a module including other solar cells, superimposed. Other structures of improving the conversion efficiency are preferably adopted. Each solar cell 301 is preferably provided to the side on which light is received, in the solar cell module 300 according to the embodiment because each solar cell 301 has a photoelectric conversion layer having a wideband gap.

Sixth Embodiment

Figure 16:
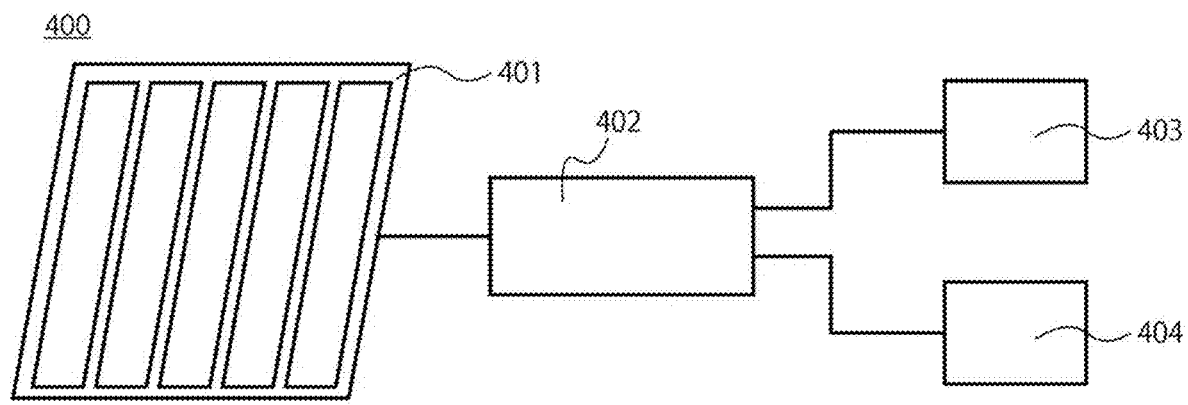
FIG. 16 is a conceptual diagram of a photovoltaic system according to a sixth embodiment.

The solar cell module 300 according to the fifth embodiment can be used as a dynamo that generates electric power in a photovoltaic system according to a sixth embodiment. The photovoltaic system according to the embodiment generates electric power with a solar cell module, and specifically has the solar cell module that generates the electric power, means for converting generated electricity into power, and a storage means for storing the generated electricity or a load that consumes the generates electricity. FIG. 16 is a conceptual diagram of a configuration of the photovoltaic system 400 according to the embodiment. The photovoltaic system 400 in FIG. 16 has the solar cell module 401 (300), the converter 402, the storage battery 403, and the load 404. Any one of the storage battery 403 and the load 404 may be omitted. The load 404 may have a configuration in which electric energy stored in the storage battery 403 can be used. The converter 402 is a device including a circuit or an element that performs power conversion, such as voltage transformation or DC-AC conversion, the device being a DC-DC converter, a DC-AC converter, or an AC-AC converter. The configuration of the converter 402 may adopt a suitable configuration in accordance with a configuration of the voltage of power generation, the storage battery 403, and the load 404.

Each solar cell 301 included in the solar cell module 300, receives light and then generates electric power. After that, the electric energy thereof is converted by the converter 402 so as to be stored in the storage battery 403 or be consumed by the load 404. The solar cell module 401 preferably includes, for example, a sunlight-tracking drive device for controlling the solar cell module 401 to surface sunlight, provided, a condenser that condenses the sunlight, provided, or a device for improving power generation efficiency, added.

The photovoltaic system 400 is preferably used in real property, such as a dwelling, a commercial facility, or a factory, or in movable property, such as a vehicle, an aircraft, or an electric device. The photoelectric conversion element having excellent conversion efficiency, according to the embodiment, is applied to the solar cell module 401 so that an increase of power generation capacity can be expected.

The present disclosure will be specifically described below based on examples, but the present disclosure is not limited to the examples below.

Example 1

Two solar cells being a top cell and a bottom cell are joined together so as to prepare a multi-junction solar cell. The conversion efficiency of the multi-junction solar cell, the open voltage (Voc), the short-circuit current density (Jsc), the power factor (FF), the light transmittance (the average from 700 to 1150 nm), the aperture ratio and the conversion efficiency, of the top cell, and furthermore, the conversion efficiency of the bottom cell, are evaluated. First, a method of preparing the top cell will be described. Soda lime glass is used as a substrate. ITO (150 nm) and $SnO_2$ (100 nm) are produced as a first electrode (a back surface transparent electrode) by sputtering. A Pd dispersion liquid (an undiluted solution in an amount of 4 wt %, an average diameter of 10 nm) is coated by spin coating and then organic matter is released by heating at 300° C. in an oxygen air flow for 30 minutes. After UV cleaning, the substrate is heated up to 370° C. and then Ga and Se are deposited thereon. Cu and Se are deposited with the temperature of the substrate being heated up to 520° C. When endothermic reaction is observed, the deposition continues until 10% of the deposition time of Cu and Se. Then, Ga and Se are finally deposited. When target Cu/Ga composition is achieved, the deposition of the Ga is stopped and then annealing is performed for five minutes, remaining intact. After that, the temperature of the substrate is decreased. When the temperature of the substrate decreases to 380° C., the deposition of the Se is stopped.

A CdS layer is prepared as an n-type layer by chemical bath deposition (CBD). Cadmium sulfate is dissolved into an ammonia solution, thiourea is added thereto, the substrate is taken out after 300 seconds, and then is washed in water. An organic Zn compound is coated on the substrate by spin coating. Heating is performed at 120° C. for five minutes so that a ZnO protective layer in an amount of 30 nm is prepared.

ZnO:Al is prepared as a second electrode (an upper portion transparent electrode) by sputtering. The temperature of the substrate is preferably 60 to 150° C. Producing the film at a relatively low temperature is preferable because an open voltage easily increases.

Ni/Al is deposited as a third electrode (an upper portion electrode). Depositing the Ni first is preferable because conductivity can be retained even when oxidization occurs at an interface with the transparent electrode. Then, the Al is deposited thereon. The film thicknesses of the Ni and the Al are preferably, approximately 60 nm (Ni) and 500 nm (Al), respectively.

$MgF_2$ is deposited so as to have a thickness of 100 nm, as an antireflection film.

Next, a method of preparing the bottom cell will be described.

An Si wafer having a thickness of 0.5 μm is arranged and an n-type dopant is ion-implanted in the side to be irradiated with light. A portion right under Ag wiring is made to be n+-type in order to forma favorable contact. An antireflection film is formed thereon. A passivation layer (a region) is made with $SiN_x$ on the side of a back face. A portion including no $SiN_x$ provided is formed and only a portion is made to conduct to the back surface Al electrode so that recombination is reduced at a crystal interface and the bottom cell having high efficiency is acquired.

A method of measuring the conversion efficiency is as follows:

A solar simulator simulating a light source with AM1.5 G is used and the amount of light is adjusted so as to be 1 sun, by using an Si cell being a reference under the light source. The temperature is 25° C. The voltage is swept so that the current density (the current divided by the cell area) is measured. In defining a horizontal axis and a vertical axis as the voltage and the current density, respectively, a point intersecting the horizontal axis is the open voltage Voc and a point intersecting the vertical axis is the short-circuit current density Jsc. When the voltage and the current density are multiplied together on a measurement curve and maximum points each are defined as Vmpp and Jmpp (a maximum power point), the following expressions are satisfied:

$$FF = (Vmpp \times Jmpp)/(Voc \times Jsc)$$

Efficiency $Eff = Voc \times Jsc \times FF$

For the transmittance, the ratio of transmitted light to incident light is measured with a sample surface orthogonal to the light source, by using a spectrophotometer. The reflectance is acquired by measuring reflected light of the sample inclined at approximately 5° from verticality with respect to the incident light. The bandgap is acquired from the transmittance and the reflectance. According to Example 1, the average value of the transmitted light having a wavelength of 700 to 1150 nm is calculated based on a wavelength range absorbed by the bottom cell, from wavelengths in a region in which the transmittance increases below the bandgap (approximately, the transmittance is 50% or more).

Table 1 shows results. Table 1 also shows results according to other examples and comparative examples.

TABLE 1

|  | Voc V | Jsc mA/cm² | FF | TOP CELL CONVERSION EFFICIENCY % | APERTURE RATIO % | TRANSLUCENCY % |
| --- | --- | --- | --- | --- | --- | --- |
| EXAMPLE 1 | 1.26 | 13.7 | 0.769 | 13.27 | 55 | 48.8 |
| COMPARATIVE EXAMPLE 1 | 1.08 | 13.7 | 0.680 | 10.06 | 100 | 84.9 |
| EXAMPLE 2 | 1.25 | 13.7 | 0.752 | 12.88 | 62 | 55.0 |
| EXAMPLE 3 | 1.24 | 13.6 | 0.743 | 12.53 | 70 | 61.7 |
| EXAMPLE 4 | 1.23 | 13.6 | 0.735 | 12.30 | 84 | 73.8 |
| EXAMPLE 5 | 1.22 | 13.5 | 0.72 | 11.86 | 95 | 80.7 |
| EXAMPLE 6 | 1.22 | 13.5 | 0.687 | 11.31 | 99 | 83.6 |
| EXAMPLE 7 | 1.18 | 13.5 | 0.685 | 10.91 | 99.4 | 84.4 |
| EXAMPLE 8 | 1.15 | 13.4 | 0.682 | 10.51 | 99.9 | 84.8 |
| EXAMPLE 9 | 1.24 | 13.6 | 0.739 | 12.46 | 79 | 69.9 |
| EXAMPLE 10 | 1.23 | 13.5 | 0.731 | 12.14 | 91 | 80.3 |
| EXAMPLE 11 | 1.23 | 13.5 | 0.732 | 12.15 | 95 | 81.0 |
| EXAMPLE 12 | 1.22 | 13.6 | 0.732 | 12.15 | 89 | 78.3 |
| EXAMPLE 13 | 1.22 | 13.4 | 0.718 | 11.74 | 98 | 83.5 |
| EXAMPLE 14 | 1.26 | 13.5 | 0.770 | 13.10 | 85 | 75.1 |
| EXAMPLE 15 | 1.26 | 13.5 | 0.775 | 13.18 | 86 | 75.2 |
| EXAMPLE 16 | 1.26 | 13.6 | 0.782 | 13.40 | 85 | 74.3 |
| EXAMPLE 17 | 1.26 | 13.5 | 0.784 | 13.34 | 85 | 73.6 |
| EXAMPLE 18 | 1.26 | 13.5 | 0.785 | 13.35 | 85 | 75.1 |
| EXAMPLE 19 | 1.26 | 13.4 | 0.786 | 13.27 | 84 | 72.0 |
| EXAMPLE 20 | 1.26 | 13.4 | 0.788 | 13.30 | 84 | 71.3 |
| EXAMPLE 21 | 1.26 | 13.3 | 0.784 | 13.14 | 85 | 72.9 |
| EXAMPLE 22 | 1.26 | 13.7 | 0.790 | 13.64 | 55 | 47.6 |
| EXAMPLE 23 | 1.26 | 13.7 | 0.790 | 13.64 | 61 | 52.8 |
| EXAMPLE 24 | 1.26 | 13.6 | 0.788 | 13.50 | 72 | 62.4 |
| EXAMPLE 25 | 1.26 | 13.6 | 0.787 | 13.49 | 80 | 69.3 |
| EXAMPLE 26 | 1.26 | 13.5 | 0.784 | 13.34 | 86 | 74.5 |
| EXAMPLE 27 | 1.26 | 13.5 | 0.783 | 13.32 | 91 | 78.8 |
| EXAMPLE 28 | 1.25 | 13.5 | 0.780 | 13.16 | 94 | 81.4 |
| EXAMPLE 29 | 1.23 | 13.5 | 0.776 | 12.89 | 98 | 84.9 |
| EXAMPLE 30 | 1.15 | 13.4 | 0.721 | 11.11 | 99.95 | 86.6 |
| EXAMPLE 31 | 1.26 | 13.6 | 0.787 | 13.49 | 82 | 71.2 |
| EXAMPLE 32 | 1.26 | 13.6 | 0.787 | 13.49 | 85 | 73.6 |
| EXAMPLE 33 | 1.26 | 13.6 | 0.787 | 13.49 | 89 | 77.0 |
| EXAMPLE 34 | 1.27 | 13.7 | 0.794 | 13.81 | 85 | 73.6 |
| EXAMPLE 35 | 1.28 | 13.7 | 0.796 | 13.96 | 86 | 74.5 |
| EXAMPLE 36 | 1.27 | 13.7 | 0.794 | 13.81 | 86 | 74.5 |
| EXAMPLE 37 | 1.28 | 13.7 | 0.797 | 13.98 | 84 | 72.7 |
| EXAMPLE 38 | 1.28 | 13.7 | 0.798 | 13.99 | 85 | 73.6 |
| EXAMPLE 39 | 1.26 | 13.5 | 0.784 | 13.34 | 85 | 75.1 |
| EXAMPLE 40 | 1.23 | 13.5 | 0.783 | 13.00 | 84 | 71.3 |

TABLE 1-continued

| | | | | | | |
|---|---|---|---|---|---|---|
| EXAMPLE 41 | 1.25 | 13.4 | 0.785 | 13.15 | 86 | 73.0 |
| EXAMPLE 42 | 1.22 | 13.6 | 0.732 | 12.15 | 92.4 | 81.6 |
| COMPARATIVE EXAMPLE 2 | 1.12 | 13.2 | 0.340 | 5.03 | 46 | 39.1 |
| COMPARATIVE EXAMPLE 3 | 1.12 | 13.3 | 0.31 | 4.62 | 91 | 79.6 |

| | BOTTOM CELL CONVERSION EFFICIENCY % | MULTI-JUNCTION SOLAR CELL CONVERSION EFFICIENCY % |
|---|---|---|
| EXAMPLE 1 | 8.79 | 22.06 |
| COMPARATIVE EXAMPLE 1 | 15.28 | 25.34 |
| EXAMPLE 2 | 9.90 | 22.78 |
| EXAMPLE 3 | 11.11 | 23.64 |
| EXAMPLE 4 | 13.29 | 25.58 |
| EXAMPLE 5 | 14.53 | 26.39 |
| EXAMPLE 6 | 15.05 | 26.37 |
| EXAMPLE 7 | 15.19 | 26.10 |
| EXAMPLE 8 | 15.27 | 25.78 |
| EXAMPLE 9 | 12.59 | 25.05 |
| EXAMPLE 10 | 14.46 | 26.60 |
| EXAMPLE 11 | 14.59 | 26.74 |
| EXAMPLE 12 | 14.10 | 26.24 |
| EXAMPLE 13 | 15.04 | 26.78 |
| EXAMPLE 14 | 13.51 | 26.61 |
| EXAMPLE 15 | 13.54 | 26.72 |
| EXAMPLE 16 | 13.38 | 26.78 |
| EXAMPLE 17 | 13.25 | 26.59 |
| EXAMPLE 18 | 13.51 | 26.86 |
| EXAMPLE 19 | 12.97 | 26.24 |
| EXAMPLE 20 | 12.84 | 26.14 |
| EXAMPLE 21 | 13.12 | 26.26 |
| EXAMPLE 22 | 8.57 | 22.21 |
| EXAMPLE 23 | 9.51 | 23.15 |
| EXAMPLE 24 | 11.22 | 24.73 |
| EXAMPLE 25 | 12.47 | 25.96 |
| EXAMPLE 26 | 13.41 | 26.74 |
| EXAMPLE 27 | 14.18 | 27.50 |
| EXAMPLE 28 | 14.65 | 27.81 |
| EXAMPLE 29 | 15.28 | 28.16 |
| EXAMPLE 30 | 15.58 | 26.69 |
| EXAMPLE 31 | 12.82 | 26.30 |
| EXAMPLE 32 | 13.25 | 26.74 |
| EXAMPLE 33 | 13.86 | 27.34 |
| EXAMPLE 34 | 13.25 | 27.06 |
| EXAMPLE 35 | 13.41 | 27.36 |
| EXAMPLE 36 | 13.41 | 27.22 |
| EXAMPLE 37 | 13.09 | 27.07 |
| EXAMPLE 38 | 13.25 | 27.24 |
| EXAMPLE 39 | 13.51 | 26.85 |
| EXAMPLE 40 | 12.84 | 25.84 |
| EXAMPLE 41 | 13.14 | 26.29 |
| EXAMPLE 42 | 14.69 | 26.83 |
| COMPARATIVE EXAMPLE 2 | 7.03 | 12.06 |
| COMPARATIVE EXAMPLE 3 | 14.32 | 18.94 |

Comparative Example 1

A top cell (solar cell) is prepared by a method the same as that according to Example 1 except that the top cell (solar cell) is prepared without spin coating with a Pd dispersion liquid. Then, a multi-junction solar cell according to a Comparative Example 1 is acquired. The solar cell is evaluated by a method the same as that according to Example 1.

Examples 2 to 8

Top cell solar cells s are prepared by a method the same as that according to Example 1 except that the top cells (solar cells) are prepared with the concentration of a Pd dispersion liquid varied. Then, multi-junction solar cells according to Examples 2 to 8 are acquired. Each solar cell is evaluated by a method the same as that according to Example 1. Note that the concentrations of the Pd dispersion liquids according to Examples 2 to 8, are 3 wt %, 2 wt %, 1 wt %, 0.75 wt %, 0.5 wt %, 0.25 wt %, and 0.125 wt %.

Example 9

A top cell (solar cell) is prepared by a method the same as that according to Example 1 except that the top cell (solar cell) is prepared with a Pt dispersion liquid having the same concentration instead of a Pd dispersion liquid. Then, a multi-junction solar cell according to Example 9 is acquired. The solar cell is evaluated by a method the same as that according to Example 1.

Example 10

Instead of formation of dots with a Pd dispersion liquid, an Mo film having a thickness of 5 nm and a Pd film having a thickness of 25 nm in sequence are produced on a first electrode, and circular dots having a dot diameter (a diameter) of 8.9 µm and a pitch of 20 µm (a distance between the centers of the dots) are formed, and a solar cell is prepared. Except the above, the top cell (solar cell) is prepared by a method the same as that according to Example 1, and then a multi-junction solar cell according to Example 10 is acquired. The solar cell is evaluated by a method the same as that according to Example 1.

Example 11

A top cell (solar cell) is prepared by a method the same as that according to Example 9 except that the solar cell is prepared by forming dots having a dot diameter (a diameter) of 3.5 µm and a pitch (distance between dot center) of 10 µm. Then, a multi-junction solar cell according to Example 11 is acquired. The solar cell is evaluated by a method the same as that according to Example 1.

Example 12

Dots are formed by imprinting instead of the formation of the dots with a Pd dispersion liquid. The shape of each dot is circular. The diameter of each dot is 230 nm. The pitch (distance between dot center) is 460 nm. Each dot includes Mo having a thickness of 5 nm and Pd having a thickness of 25 nm, layered. Except the above, a top cell (solar cell) is prepared by a method the same as that according to Example 9, and then a multi-junction solar cell according to Example 12 is acquired. The solar cell is evaluated by a method the same as that according to Example 1.

Example 13

A top cell (solar cell) is prepared by a method the same as that according to Example 1 except that an $SiN_x$ film having a thickness of 1 nm is produced on a first electrode by CVD before coating a Pd dispersion liquid. Then, a multi-junction solar cell according to Example 13 is acquired. The solar cell is evaluated by a method the same as that according to Example 1.

Examples 14 to 21

According to Examples 14 to 21, Mo is used for dots, the shape of each dot is circular, and the height of each dot is 40 nm. Then, a dot region is prepared similarly to Example 10. The diameters of the dots according to Examples 14 to 22 are 3 µm, 4 µm, 5 µm, 6 µm, 7 µm, 8 µm, 9 µm, and 10 µm, in sequence. The pitch of each dot is adjusted to achieve the aperture ratio described in Table 1. Except the above, top cell solar cells are prepared by a method the same as that according to Example 10, and then multi-junction solar cells according to Examples 14 to 21 are acquired. The solar cells are evaluated by a method the same as that according to Example 1.

Examples 22 to 30

According to Examples 22 to 30, Mo is used for dots, the shape of each dot is circular, the height of each dot is 50 nm, and the diameter of each dot is 6 µm. Then, a dot region is prepared similarly to Example 10. The pitch of each dot is adjusted to achieve the aperture ratio described in Table 1. Except the above, top cell solar cells are prepared by a method the same as that according to Example 10, and then multi-junction solar cells according to Examples 22 to 30 are acquired. The solar cell is evaluated by a method the same as that according to Example 1.

Examples 31 to 33

According to Examples 31 to 33, Mo is used for dots, the shape of each dot is hexagon-nut-type, the height of each dot is 50 nm, and the diameter of each dot is 6 µm. Then, a dot region is prepared similarly to Example 10. The pitch of each dot is adjusted to achieve the aperture ratio described in Table 1. Furthermore, the dots are hollow and have a circular cavity. When the dots have no hollow, the aperture ratios according to Examples 31 to 33 are 80%. The hollow circle in each dot according to Example 31 has a diameter of 2 µm, the hollow circle in each dot according to Example 32 has a diameter of 3 µm, and the hollow circle in each dot according to Example 33 has a diameter of 4 µm. Except the above, top cell solar cells are prepared by a method the same as that according to Example 10, and then multi-junction solar cells according to Examples 31 to 33 are acquired. The solar cell is evaluated by a method the same as that according to Example 1.

Examples 34 to 38

According to Examples 34 to 38, as a first insulating film, $AlO_x$ or $SiN_x$ is produced on a first electrode and a dot region is formed. The $AlO_x$ having a thickness of 5 nm, the $AlO_x$ having a thickness of 15 nm, the $SiN_x$ having a thickness of 5 nm, the $SiN_x$ having a thickness of 10 nm, and the $SiN_x$ having a thickness of 20 nm are provided in sequence for the first insulating films according to Examples 34 to 38. The shape of each dot is circular (hollow), the height of each dot is 80 nm, the diameter of each dot is 6 µm. Then, dot regions are prepared similarly to Example 10. Except the above, top cell solar cells are prepared by a method the same as that according to Example 10, then multi-junction solar cells according to Examples 34 to 38 are acquired. The solar cell is evaluated by a method the same as that according to Example 1.

Examples 39 to 41

According to Examples 39 to 41, a top cell (solar cell) is prepared by a method the same as that according to Example 1 except that a dot region is prepared by coating a dispersion liquid, including metal particles each having an average diameter of 6 µm (Example 39: Mo, Example 40: Ru, and Example 41: Pd), and a multi-junction solar cell according to Examples 39 to 41 is acquired. Then, the solar cell is evaluated by a method the same as that according to Example 1.

Example 42

According to Example 42, Mo is uniformly produced on a transparent conductive film and then a copolymer that makes phase separation with self-organization, is produced thereon so that a phase separation membrane having an average diameter of 50 nm and a pitch of 150 nm (a dot center-to-center distance), is formed. The Mo at a region at which no phase separation membrane is present, is removed by a dry etching method or a wet etching method, and then $SiN_x$ is produced on the entirety thereof. The copolymer and the $SiN_x$ produced thereon are simultaneously removed. Except that, a top cell (solar cell) is prepared by a method the same as that according to Example 10 so that a multi-junction solar cell according to Example 42 is acquired. Then, the solar cell is evaluated by a method the same as that according to Example 1.

Furthermore, the average diameter of dots in a dot region in an in-plane direction, is made to be smaller than the average crystal grain size of a light-absorbing layer in the in-plane direction at an interface on the side of a first electrode so that improvement of power generation efficiency can be achieved.

Comparative Example 2

Instead of formation of dots with a Pd dispersion liquid, a gold thin film having a thickness of 5 nm is formed and then a light-absorbing layer 3 is produced on the gold thin film. Except the above, a top cell (solar cell) is prepared by a method the same as that according to Example 1, and then a multi-junction solar cell according to Comparative Example 2 is acquired. The gold thin film is atomized by heat treatment during the production of the light-absorbing layer 3.

Comparative Example 3

A top cell (solar cell) is prepared by a method the same as that according to Example 15 except that Ni is used for dots. Then, a multi-junction solar cell according to Comparative Example 3 is acquired.

Introducing the metal dots makes an oxide layer barely formed at a contact interface with the light-absorbing layer so that a favorable contact is formed and Voc increases. A favorable contact is expected to be formed on even the transparent electrode by reviewing the heat treatment and the processes. However, it can be thought that the processes are required to have a low temperature because the light-absorbing layer oxidizes at a high temperature and the mobility of the light-absorbing layer barely increases.

Providing only the dots causes the conduction from the transparent electrode to be present. Thus, the region except the dots becomes further favorable by introducing the insulating layer in order to prevent a conduction path between the transparent electrode and the light-absorbing layer. When the area ratio of the metal dot region is higher, the FF is high. When the metal dots and the insulating film are provided, the FF collectively increases. The aperture ratio is important in order to increase the power generation capacity of the bottom cell or a middle cell. However, when the aperture ratio is close to 100%, the FF of the top cell degrades. This is because contribution of the conduction between the transparent electrode and the light-absorbing layer increases. When Ni is used for the dots, a dot pattern can be formed similarly to the use of Mo. After the production of the light-absorbing layer, when analysis of the concentration of an element in the film is performed by secondary ion mass spectrometry (SIMS), a state where the Ni has segregated on a front surface and a back surface of the film can be observed. Accordingly, a leak path is formed in the light-absorbing layer so that the conversion efficiency excessively degrades.

Here, some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
   a first electrode;
   a second electrode;
   a light-absorbing layer interposed between the first electrode and the second electrode; and
   a particle region interposed between the first electrode and the light-absorbing layer, the particle region including particles, wherein
   the particles consist of conductive material,
   the particles are in direct contact with the light absorbing layer,
   at least one of the particles is in direct contact with both of the first electrode and the light absorbing layer,
   the particles have a hollow shape or an opening shape,
   the particles in the particle region each including at least one selected from a group consisting of: metal, alloy, conductive oxide, and conductive nitride,
   a diameter of the particles is 2 nm to 50 μm; and
   the particle region having an aperture ratio that is 80 to 99.95%, the aperture ratio defining a collective surface area of the particles to a surface area of the first electrode.

2. The solar cell according to claim 1, further comprising a first insulating film, wherein the first insulating film is interposed between the particles in the particle region, and wherein the particles are in direct contact with the first insulating film.

3. The solar cell according to claim 1, wherein the particles in the particle region each consist of at least one metal selected from a group consisting of: Mo, Ru, Rh, Pd, Ag, Ir, and Pt, or at least one conductive oxide selected from a group consisting of: $RuO_2$, PdO, $Rh_2O_3$, $PtO_2$, and $IrO_2$.

4. The solar cell according to claim 1, wherein a minimum particle diameter and a maximum particle diameter of the particles in the particle region are 0.9 to 1.1 times an average particle diameter of the particles—in the particle region, and a minimum value and a maximum value of particle intervals in the particle region are 0.8 to 1.2 time an average value of the particle intervals in the particle region.

5. The solar cell according to claim 2, wherein the first insulating film includes at least one oxide film selected from a group consisting of: $AlO_x$, $SiO_x$, MgO, and $(Al, Si, Mg)O_x$, or at least one nitride film selected from a group consisting of: $SiN_x$, $AlN_x$, $GaN_x$, and $(Si, Al, Ga)N_x$, and wherein x is an integer greater than or equal to 1.

6. A multi-junction solar cell comprising the solar cell according to claim 1.

7. A solar cell module comprising the solar cell according to claim 1.

8. A solar cell module comprising the multi-junction solar cell according to claim 6.

9. A photovoltaic system comprising the solar cell module according to claim 7.

10. A photovoltaic system comprising the solar cell module according to claim 8.

11. The solar cell according to claim 1 wherein the first electrode is a transparent electrode, and the second electrode is a transparent electrode.

12. The solar cell according to claim 1, wherein the particles consist of metal.

13. The solar cell according to claim 1, wherein the particles are separate from each other.

14. The solar cell according to claim 1, wherein the particles are sandwiched between the first electrode and the light absorbing layer in a stacking direction of the first electrode and the light absorbing layer and the particles are in direct contact with both of the first electrode and the light absorbing layer.

15. The solar cell according to claim 1, wherein surfaces of the particles being in direct contact with the first electrode are opposite to surfaces of the particles being in direct contact with the light absorbing layer.

16. The solar cell according to claim 1, wherein side surfaces of the particles which face others of the particles are in direct contact with the light absorbing layer.

17. The solar cell according to claim 1, wherein the particles have the hollow shape.

18. The solar cell according to claim 1, wherein each of the particles having the hollow shape or the opening shape has an opening in the center of each of the particles.

19. The solar cell according to claim 1, wherein a height of the particles is 5 nm to 50 μm.

20. The solar cell according to claim 1, wherein each of the particles is in direct contact with both the first electrode and the light absorbing layer.

* * * * *